United States Patent
Zhu

(10) Patent No.: US 11,532,743 B2
(45) Date of Patent: Dec. 20, 2022

(54) SEMICONDUCTOR DEVICE WITH U-SHAPED CHANNEL AND MANUFACTURING METHOD THEREOF, AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 17/110,630

(22) Filed: Dec. 3, 2020

(65) Prior Publication Data

US 2021/0175355 A1 Jun. 10, 2021

(30) Foreign Application Priority Data

Dec. 6, 2019 (CN) .......................... 201911262334.5

(51) Int. Cl.
| | |
|---|---|
| *H01L 29/78* | (2006.01) |
| *H01L 29/06* | (2006.01) |
| *H01L 29/10* | (2006.01) |
| *H01L 29/66* | (2006.01) |

(52) U.S. Cl.
CPC ...... *H01L 29/7827* (2013.01); *H01L 29/0649* (2013.01); *H01L 29/1033* (2013.01); *H01L 29/66666* (2013.01)

(58) Field of Classification Search
CPC ............. H01L 29/7827; H01L 29/0649; H01L 29/1033; H01L 29/66666; H01L 29/0847; H01L 29/165; H01L 29/66545; H01L 29/7848; H01L 29/1037; H01L 29/401; H01L 29/42356; H01L 29/4236
USPC ........................................................ 257/329
See application file for complete search history.

(56) References Cited

U.S. PATENT DOCUMENTS

| | | | | |
|---|---|---|---|---|
| 2016/0056295 | A1* | 2/2016 | Wen | ..................... H01L 29/7856 257/369 |
| 2017/0098709 | A1* | 4/2017 | Dias | ..................... H01L 27/1211 |
| 2018/0097111 | A1* | 4/2018 | Zhu | ................. H01L 21/823807 |
| 2018/0366545 | A1* | 12/2018 | Deng | ................ H01L 29/42376 |
| 2019/0198669 | A1* | 6/2019 | Park | ..................... H01L 29/7827 |
| 2020/0144254 | A1* | 5/2020 | Song | ..................... H01L 29/0847 |

* cited by examiner

*Primary Examiner* — Mohammad M Hoque
(74) *Attorney, Agent, or Firm* — Pillsbury Winthrop Shaw Pittman, LLP

(57) ABSTRACT

A semiconductor device with a U-shaped channel and a manufacturing method thereof and an electronic apparatus including the semiconductor device are disclosed. According to embodiments, the semiconductor device may include: a channel portion extending vertically on a substrate and having a U-shape in a plan view; source/drain portions located at upper and lower ends of the channel portion and along the U-shaped channel portion; and a gate stack overlapping the channel portion on an inner side of the U shape.

37 Claims, 21 Drawing Sheets

SEMICONDUCTOR DEVICE WITH U-SHAPED CHANNEL AND MANUFACTURING METHOD THEREOF, AND ELECTRONIC APPARATUS INCLUDING THE SAME

This application claims the benefit of Chinese Patent Application No. 201911262334.5, filed on Dec. 6, 2019, which is incorporated herein in its entirety by reference.

TECHNICAL FIELD

The present disclosure relates to the field of semiconductors, more particularly, to a semiconductor device with a U-shaped channel and a manufacturing method thereof and an electronic apparatus including the semiconductor device.

BACKGROUND

With the continuous miniaturization of semiconductor devices, devices with various structures such as fin field effect transistors (FinFET), multi-bridge transistor field effect transistors (MBCFET), etc. have been proposed.

SUMMARY

However, these devices still may not meet requirements due to the limitation of device structure in terms of increasing integration density and enhancing device performance.

In view of this, it is at least part of the purpose of the present disclosure to provide a semiconductor device with a U-shaped channel, a manufacturing method thereof and an electronic apparatus comprising the semiconductor device.

According to an aspect of the present disclosure, there is provided a semiconductor device comprising: a channel portion extending vertically on a substrate and having a U-shape in a plan view; source/drain portions located at upper and lower ends of the channel portion and along the U-shaped channel portion; and a gate stack overlapping the channel portion on an inner side of the U shape.

According to an aspect of the present disclosure, there is provided a method of manufacturing a semiconductor device, the method comprising: providing a stack of a first material layer, a second material layer and a third material layer on a substrate; patterning the stack into a bar shape extending along a first direction; forming a first active layer on a sidewall of the stack patterned in the bar shape; forming a bar-shaped opening extending in a first direction in the stack patterned in the bar-shape, so that the stack is annular; replacing the second material layer with a dummy gate through the opening; forming source/drain portions on upper and lower sides of the dummy gate; removing the dummy gate through the opening; and forming a gate stack in the opening, an outer edge of the gate stack being embedded in a space left due to the removal of the dummy gate.

According to an aspect of the present disclosure, there is provided an electronic apparatus comprising a semiconductor device as described herein.

According to embodiments of the present disclosure, there is provided a semiconductor device with a new structure, which has advantages of, for example, high performance and high density.

BRIEF DESCRIPTION OF THE DRAWINGS

The aforementioned and other objectives, features and advantages would become more apparent through the following description of the embodiments of the present disclosure with reference to the accompany drawings, in the accompanying drawings:

FIGS. 1-23 schematically show some stages in the process of manufacturing a semiconductor device according to the embodiments of the present disclosure, wherein FIGS. 3(a), 4, 5(a), 6(a), 9(a), 11(a), 15(a), and 21(a) are top views, FIGS. 1, 2, 3(b), 5(b), 6(b), 7(a), 7(b), 8, 9(b), 10, 11(b), 12(a), 13, 14(a), 15(b), 16(a), 17(a), 18(a), 19(a), 20(a), 21(b), 22(a), and 23 are cross-sectional views along respective line AA'.

Throughout the drawings, the same or similar reference numerals indicate the same or similar components.

DETAILED DESCRIPTION OF EMBODIMENTS

Figure 1:
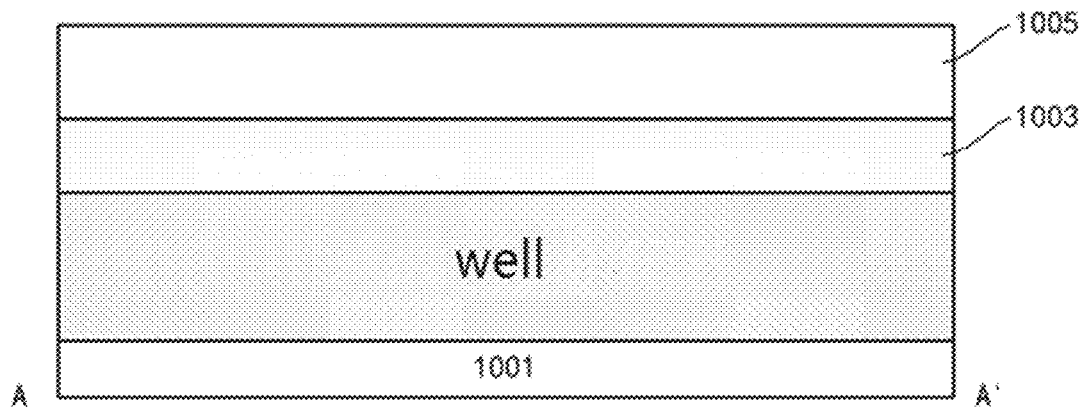

Hereinafter, embodiments of the present disclosure will be described with reference to the drawings. However, it should be understood that these descriptions are only exemplary and are not intended to limit the scope of the present disclosure. In addition, in the following description, descriptions of well-known structures and technologies are omitted to avoid unnecessarily obscuring the concept of the present disclosure.

Various structural schematic diagrams according to embodiments of the present disclosure are shown in the drawings. The figures are not drawn to scale, some details are enlarged and some details may be omitted for clarity of presentation. The shapes of the various areas and layers shown in the figures and the relative size and positional relationships between them are only exemplary. In practice, there may be deviations due to manufacturing tolerances or technical limitations. Areas/layers with different shapes, sizes, and relative positions may be designed as needed.

In the context of the present disclosure, when a layer/element is referred to as being "on" another layer/element, the layer/element may be directly on the other layer/element, or there may be an intermediate layer/element between them. In addition, if a layer/element is located "on" another layer/element in one orientation, the layer/element may be located "under" the other layer/element when the orientation is reversed.

According to the embodiments of the present disclosure, there is provided a vertical type semiconductor device having an active area arranged vertically on a substrate (for example, in a direction substantially perpendicular to the surface of the substrate). The channel portion may be U-shaped in a plan view (for example, a top view viewed from above the substrate), so that the channel portion may be in the form of a U-shaped nano-sheet, and therefore such a device may be called a U-shaped nano-sheet field effect transistor (U-shaped nano-sheet FET, USNFET). With the U-shaped channel portion, the channel width may be increased. As described below, the U-shaped nano-sheet may be formed by epitaxial growth, so it may be a single piece and may have a substantially uniform thickness.

The semiconductor device may further include source/drain portions respectively provided at upper and lower ends of the channel portion. The source/drain portions may be arranged along the channel portion, so that it may also be U-shaped in the plan view. According to the embodiments, the source/drain portions may protrude toward the inner side of the U shape with respect to the channel portion, so that the source/drain portions and the channel portion are C-shaped in a cross-sectional view. The C shape may facilitate defining a space for accommodating a gate stack.

The source/drain portions may have a certain doping. For example, for a p-type device, the source/drain portions may have a p-type doping; for a n-type device, the source/drain portions may have a n-type doping. A doped profile of the source/drain portions may have an end portion that overlaps the gate stack to reduce external resistance. The channel part may have a certain doping to adjust the threshold voltage of the device. Alternatively, the semiconductor device may be a junctionless device, wherein the channel portion and the source/drain portions may have the same conductivity type doping. Alternatively, the semiconductor device may be a tunneling type device, wherein the source/drain portions at both ends of the channel portion may have doping types opposite to each other.

The channel part may include a single crystal semiconductor material. Of course, the source/drain portions may also include a single crystal semiconductor material. For example, they may all be formed by epitaxial growth.

Such a semiconductor device may be manufactured as follows, for example.

According to an embodiment, a stack of a first material layer, a second material layer, and a third material layer may be provided on the substrate. The first material layer may define the position of the lower source/drain portion, the second material layer may define the position of the gate stack, and the third material layer may define the position of the upper source/drain portion. The first material layer may be provided via a substrate, such as the upper portion of the substrate. Alternatively, the first material layer, the second material layer, and the third material layer may be formed in sequence on the substrate by, for example, epitaxial growth. If the first material layer and the third material layer are directly used as source/drain portions below, they may be doped in situ while being epitaxially grown.

The stack may be patterned into a bar shape extending in a first direction. On the sidewalls of the bar-shaped stack, a first active layer may be formed. The first active layer may define the channel portion. Since it is formed around the sidewalls of the bar-shaped stack, the first active layer may be in a closed pattern in the plan view, for example, a ring shape such as a rectangular ring or a rounded rectangular ring. Two devices may be formed based on the first active layer with this closed pattern, so that the channel portion of each device may be U-shaped. Of course, it is also possible to form a single device based on a closed pattern.

The gate stack may be formed inside the ring pattern. For this, an opening may be formed in the bar-shaped stack to form a space inside the ring pattern. The opening may also extend substantially in the first direction, so that the above-mentioned stack is annular, which facilitates formation of the source/drain portions along the channel portion. The second material layer may be replaced with a gate stack through the opening formed in this way.

In order to facilitate the formation of the source/drain portions, for example, the source/drain portions may be formed by doping the first material layer and the third material layer (especially when they are not doped while being formed), or may be formed by growing the second active layer additionally as described below, wherein a dummy gate may be formed first. For example, the second material layer may be removed by selective etching through the above-mentioned opening, thus a space is left between the first material layer and the second material layer. A dummy gate may be formed in this space. The dummy gate covers the portion of the first active layer between the first material layer and the second material layer.

Source/drain portions may be formed on the upper and lower sides of the dummy gate. For example, the source/drain portions may be formed by doping the first material layer and the third material layer. The doping may be achieved by a solid phase dopant source layer. Alternatively, the first material layer and the third material layer may be at least partially removed (or even completely removed to expose the first active layer), and the second active layer may be grown on the upper and lower sides of the dummy gate. The second active layer may be doped in situ during growth. Impurities may be activated by annealing, so that the impurities may diffuse into the first active layer and overlap with the end of the dummy gate to a certain extent.

After that, the dummy gate may be replaced with a gate stack by a replacement gate process.

The present disclosure may be presented in various forms, some examples of which will be described below. In the following description, selection of various materials is involved. In addition to the function thereof (for example, semiconductor materials are used to form active areas and dielectric materials are used to form electrical isolation), the selection of materials also considers etching selectivity. In the following description, the required etching selectivity may be or may not be indicated. It should be clear to those skilled in the art that when etching a certain material layer is mentioned below, if it is not mentioned that other layers are also etched or the figures do not show that other layers are also etched, then the etching may be selective, and the material layer may have etching selectivity relative to the other layers exposed to the same etching recipe.

FIGS. 1 to 23 schematically show some stages in the process of manufacturing a semiconductor device according to the embodiments of the present disclosure.

As shown in FIG. 1, a substrate 1001 is provided (the upper portion of which may form the above-mentioned first material layer). The substrate 1001 may be a substrate of various forms, including but not limited to a bulk semiconductor material substrate such as a bulk Si substrate, a semiconductor on insulator (SOI) substrate, a compound semiconductor substrate such as a SiGe substrate, or the like. In the following description, for convenience of description, a bulk Si substrate is taken as an example for description. Here, a silicon wafer is provided as the substrate 1001.

In the substrate 1001, a well region may be formed. If a p-type device is to be formed, the well region may be a n-type well; if a n-type device is to be formed, the well region may be a p-type well. The well region may be formed, for example, by implanting corresponding conductivity type dopants (p-type dopants such as B or In, or n-type dopants such as As or P) into the substrate 1001 and then performing thermal annealing. There are many ways to provide such a well region in the art, which will not be repeated here.

On the substrate 1001, a second material layer 1003 and a third material layer 1005 may be formed by, for example, epitaxial growth. The second material layer 1003 may be used to define the position of the gate stack. The thickness thereof is, for example, selected from about 20 nm-50 nm. The third material layer 1005 may be used to define the position of the upper source/drain portion. The thickness thereof is, for example, selected from about 20 nm-200 nm.

The substrate 1001 and adjacent layers among the above-mentioned layers formed thereon may have etching selectivity with respect to each other. For example, in a case where the substrate 1001 is a silicon wafer, the second material layer 1003 may include SiGe (for example, the atomic percentage of Ge is about 10%-30%), and the third material layer 1005 may include Si.

Figure 2:
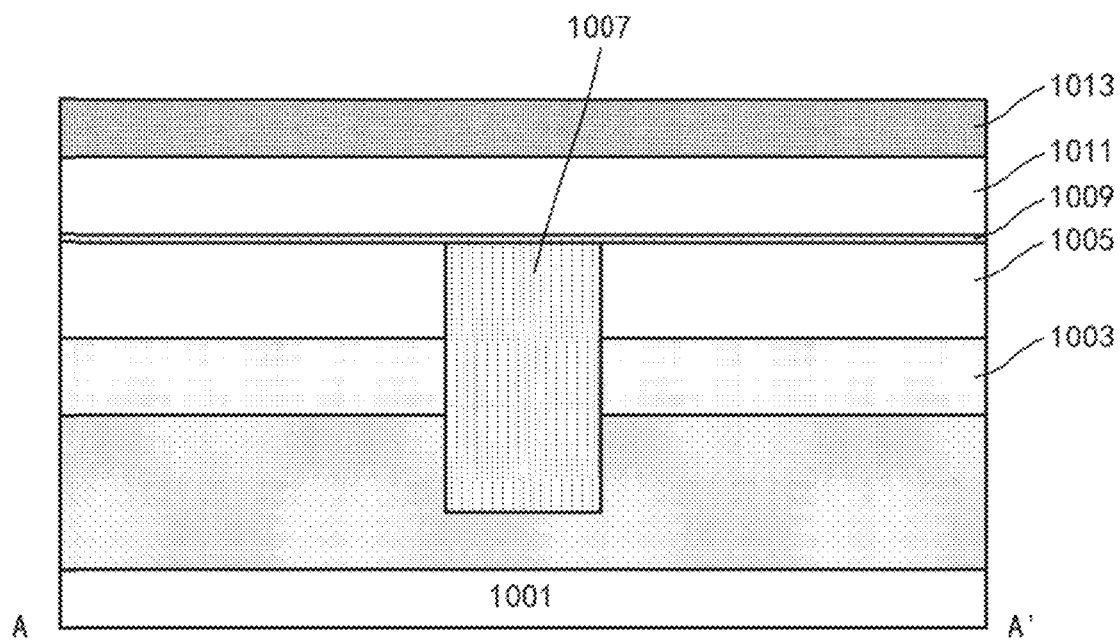

As shown in FIG. 2, in the substrate 1001, an active area may be defined by an isolation portion 1007, such as shallow trench isolation (STI) to define the active layer. For example, the isolation portion 1007 may surround various active areas. Here, the isolation portion 1007 may pass through the second material layer 1003 and the third material layer 1005.

According to the embodiment, spacer pattern transfer technology is used in the following composition. To form the spacer, a mandrel may be formed. Specifically, a layer 1011 for a mandrel pattern may be formed on the third material layer 1005 by, for example, deposition. For example, the layer 1011 used for the mandrel pattern may include amorphous silicon or polysilicon, with a thickness selected from about 50 nm-150 nm. In addition, for a better etching control, an etch stop layer 1009 may be formed first by, for example, deposition. For example, the etch stop layer 1009 may include oxide (for example, silicon oxide) and have a thickness selected from about 2 nm-10 nm.

On the layer 1011 for the mandrel pattern, a hard mask layer 1013 may be formed by, for example, deposition. For example, the hard mask layer 1013 may include nitride (for example, silicon nitride) and have a thickness selected from about 50 nm-100 nm.

The layer 1011 for the mandrel pattern may be patterned into a mandrel pattern.

Figure 3A:
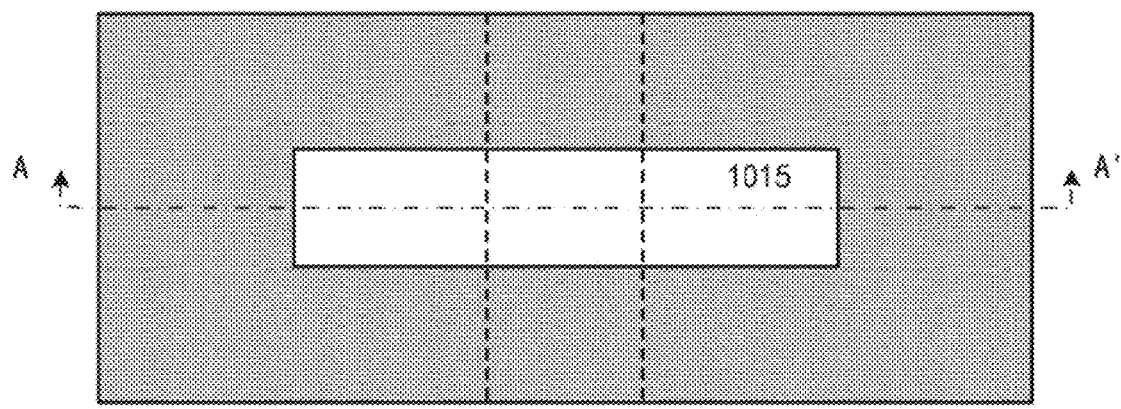
Figure 3B:
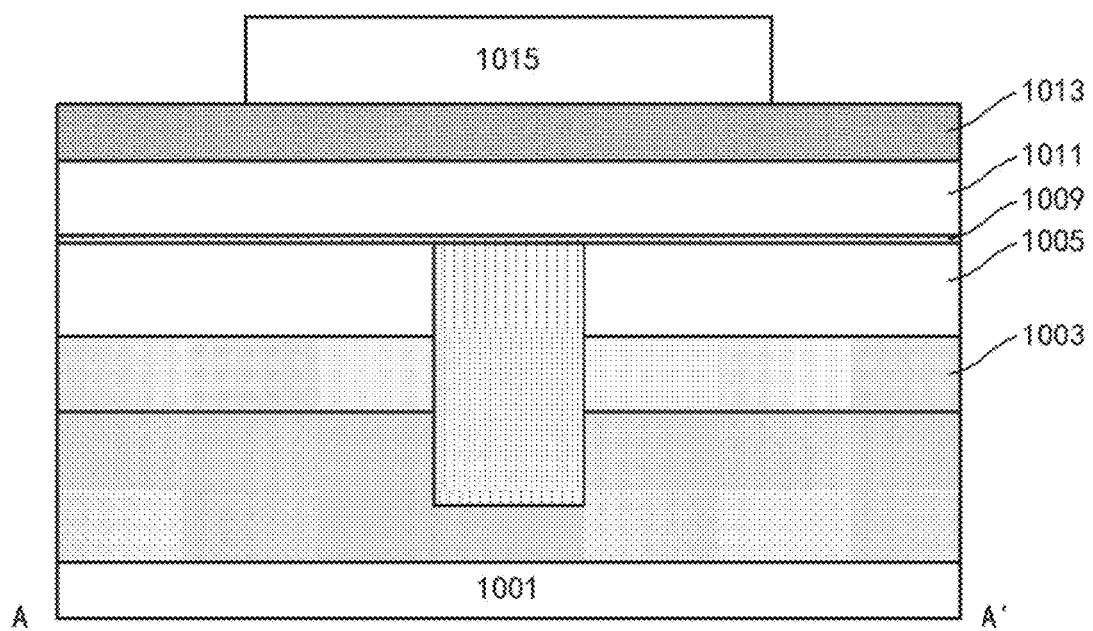
Figure 4:
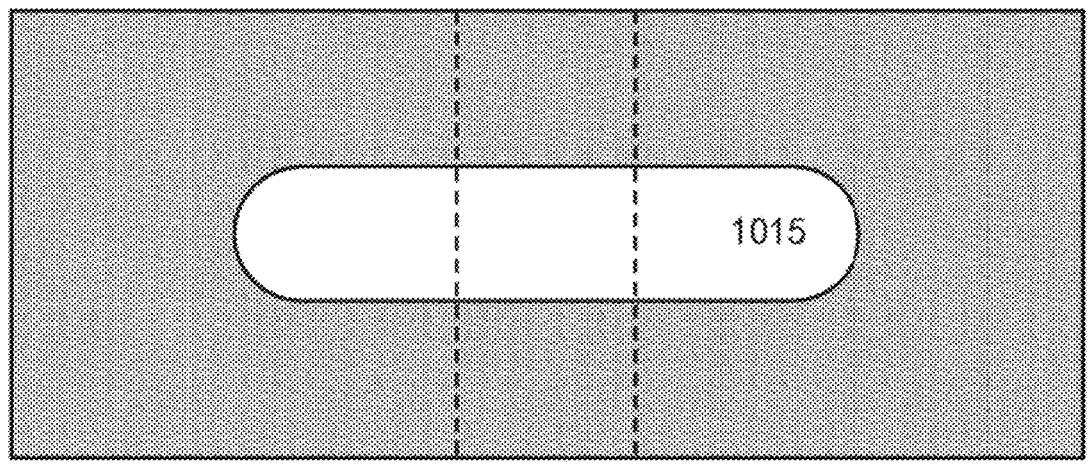

For example, as shown in FIGS. 3(*a*) and 3(*b*), a photoresist 1015 may be formed on the hard mask layer 1013, and patterned by photolithography to be a bar-like pattern extending along a first direction (the horizontal direction in the drawing). Here, the bar-like pattern is shown as extending across the isolation portion 1007 and on opposite sides of the isolation portion 1007, so that two devices may be defined later. However, the present disclosure is not limited to this. For example, the bar-like pattern may extend within the area defined by the isolation portion 1007, so that a single device may be defined.

In the example of FIG. 3(*a*), portions of the bar-like pattern on opposite sides of the isolation portion 1007 may have substantially the same length, so that channel portions of two subsequently obtained devices may have substantially the same channel width. However, the present disclosure is not limited to this. For example, according to the performance requirements of the two devices of the design, the extension lengths of the bar-like pattern on the opposite sides of the isolation portion 1007 may be different.

In the example of FIG. 3(*a*), the bar-like pattern is shown to have a rectangular shape in a top view. However, the present disclosure is not limited to this. According to other embodiments, the bar-like pattern may have other shapes, such as an oval shape, a rounded rectangular shape (see FIG. 4), etc.

Figure 5A:
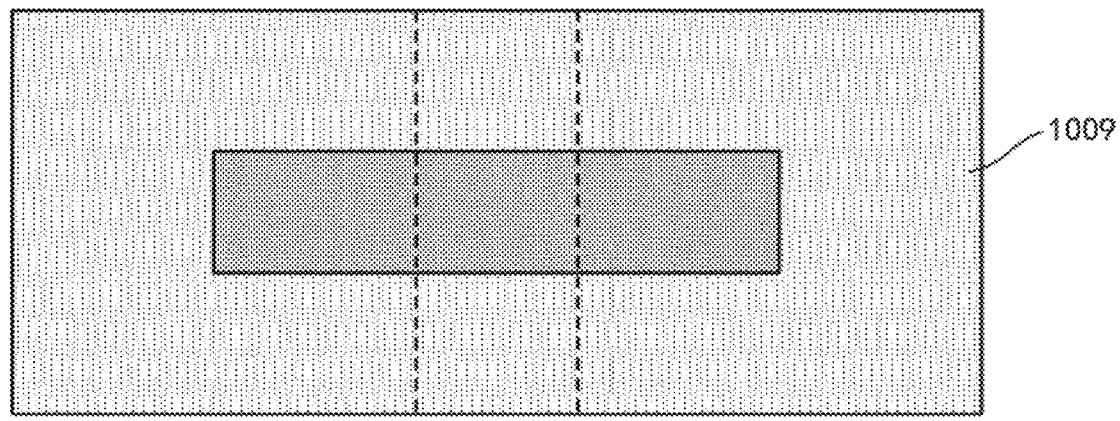
Figure 5B:
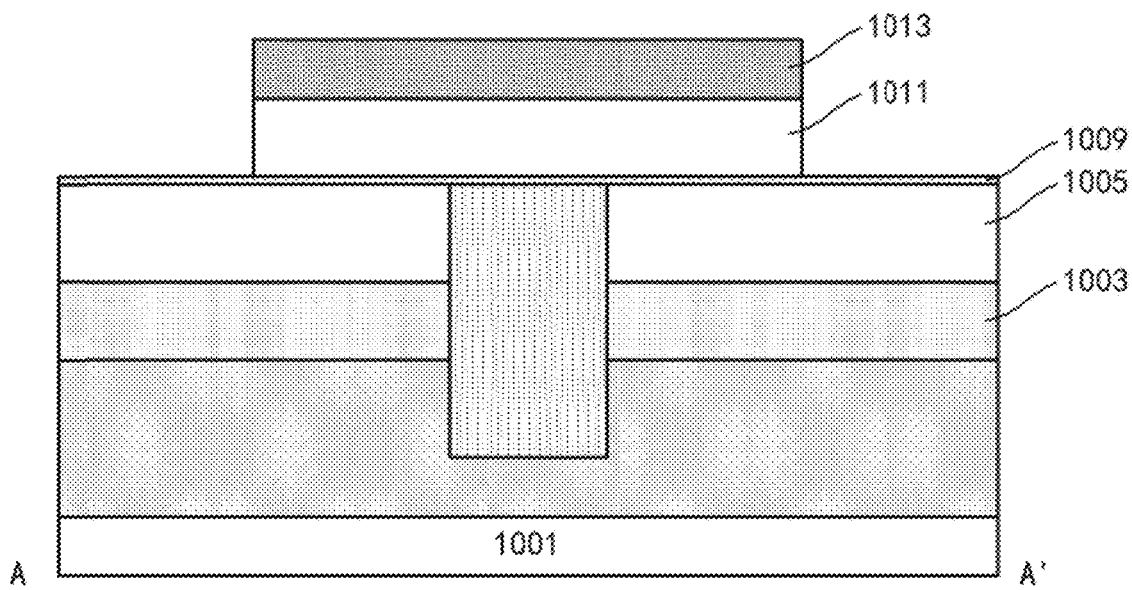

As shown in FIGS. 5(*a*) and 5(*b*), the photoresist 1015 may be used as an etching mask, and the hard mask layer 1013 and layer 1011 for the mandrel pattern are selectively etched in sequence by, for example, reactive ion etching (RIE), to transfer the photoresist pattern to the hard mask layer 1013 and the layer 1011 for the mandrel pattern. The etching may stop at the etch stop layer 1009. After that, the photoresist 1015 may be removed.

Figure 6A:
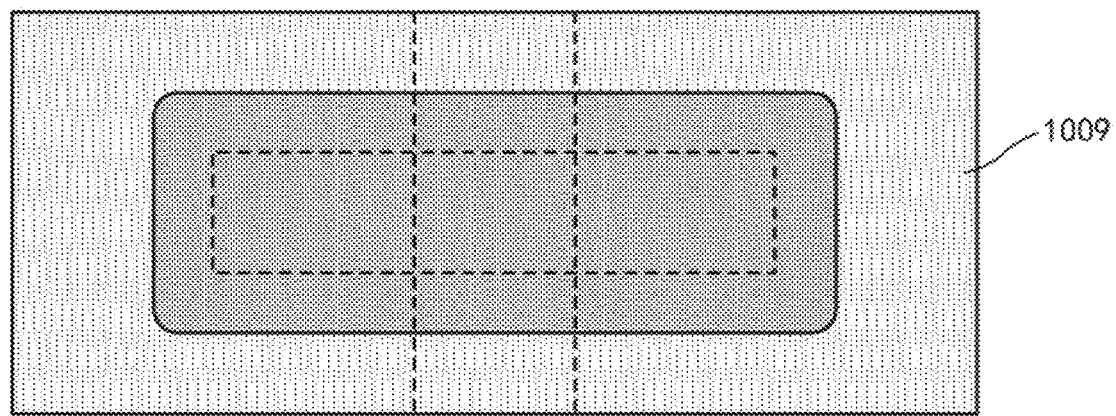
Figure 6B:
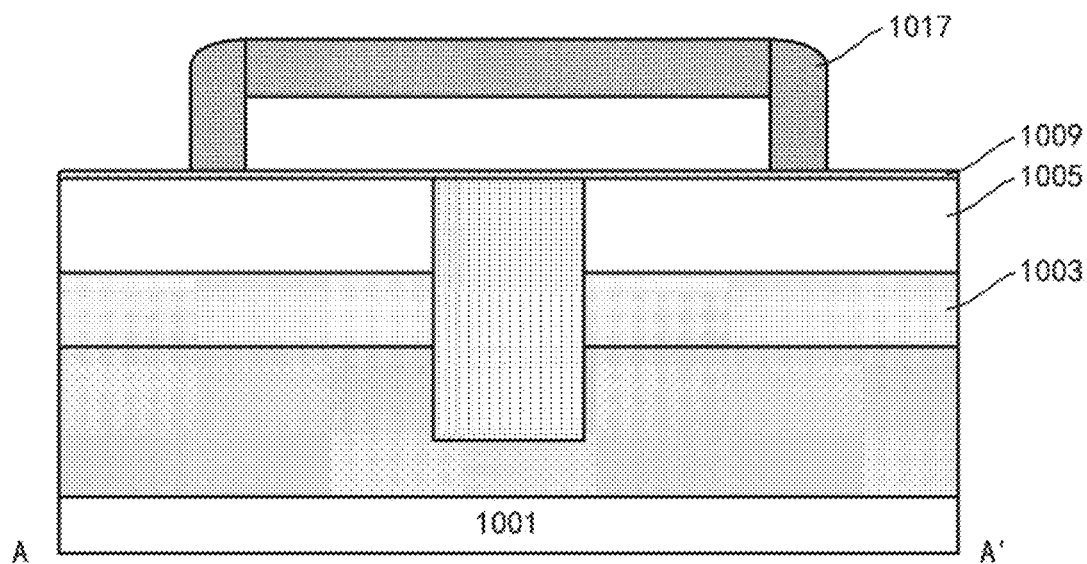

As shown in FIGS. 6(*a*) and 6(*b*), a spacer 1017 may be formed on the sidewalls of the mandrel pattern 1011. For example, a layer of nitride with a thickness selected from about 10 nm-50 nm may be deposited in a substantially conformal manner, and then the deposited nitride layer may be anisotropically etched, such as by RIE (which may be stopped at the etch stop layer 1009) in the vertical direction, to remove the horizontal extension portion and leave the vertical extension portion thereof, thereby obtaining the spacer 1017. The spacer 1017 may then be used to define the location of the active area of the device.

As shown in the top view in FIG. 6(*a*), the spacer 1017 may be formed around the sidewalls of the mandrel pattern 1011, thereby being annular. In this example, the spacer 1017 and the hard mask layer 1013 include the same material (nitride), so they may appear as one body in the top view of FIG. 6(*a*).

Figure 7A:
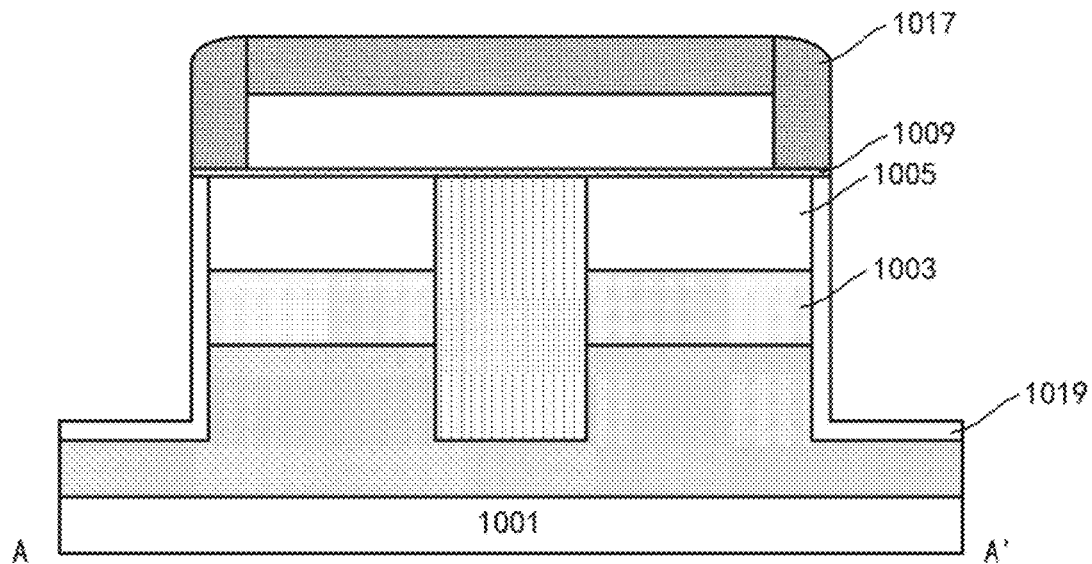
Figure 7B:
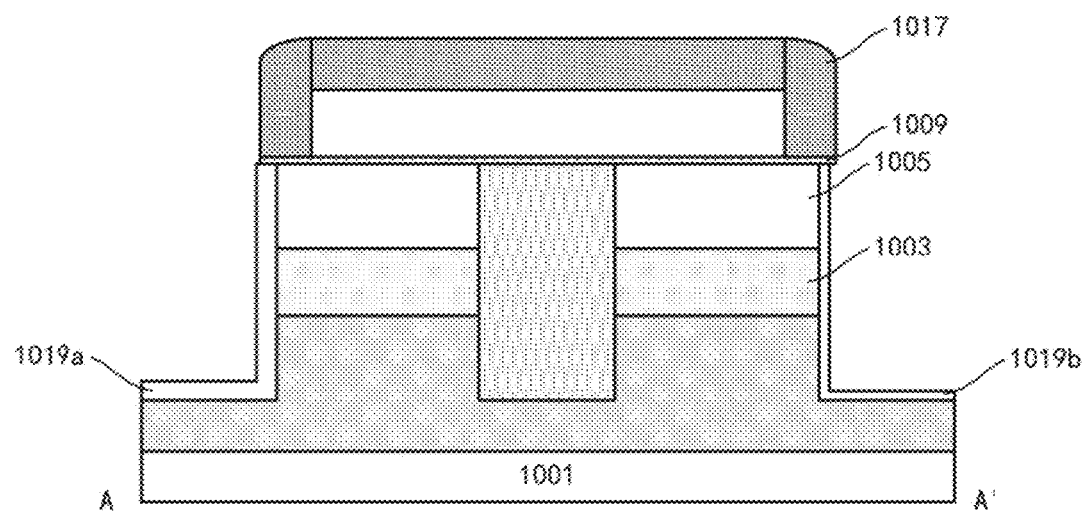

As shown in FIG. 7(*a*), the hard mask layer 1013 and the spacer 1017 may be used to pattern the third material layer 1005, the second material layer 1003 and the upper portion of the substrate 1001 (first material layer) into ridge-like structures. For example, the hard mask layer 1013 and the spacer 1017 may be used as an etching mask, and each layer is selectively etched in sequence by, for example, RIE, to transfer the pattern to the lower layer. The etching may enter the well region of the substrate 1001. Thus, on the opposite sides of the isolation portion 1007, the upper portion of the substrate 1001, the second material layer 1003 and the third material layer 1005 may form ridge-like structures extending in the first direction, respectively.

A first active layer may be formed on the sidewall of the ridge-like structure so as to subsequently define the channel portion. For the convenience of the following patterning, the portion of the first active layer serving as the channel portion may be formed under the spacer 1017 (which may minimize a protective layer provided for the channel portion in the following patterning). For example, the ridge-like structure may be etched back so that its outer peripheral sidewall is recessed transversely with respect to the outer peripheral sidewall of the spacer 1017. To control the etching depth, atomic layer etching (ALE) may be used. Then, a first active layer 1019 may be formed on the sidewall of the ridge-like structure by, for example, selective epitaxial growth. Due to the selective epitaxial growth, the first active layer 1019 may be formed on the vertical sidewall of the ridge-like structure and the surface of the substrate 1001. The first active layer 1019 may then define the channel portion, with a thickness selected, for example, from about 3 nm-15 nm. According to an embodiment of the present disclosure, the thickness of the first active layer 1019 (which is then used as the channel portion) may be determined by an epitaxial growth process, and thus the thickness of the channel portion may be better controlled.

On the opposite sides of the isolation portion 1007, the vertical portions of the first active layer 1019 may respectively form a U shape corresponding to the spacer 1017.

In FIG. 7(*a*), the sidewall of the portion of the first active layer 1019 on the vertical sidewalls of the ridge-like structure is shown to be substantially flush with the sidewall of the spacer 1017. This may be achieved by controlling the amount of etch-back and the epitaxial growth thickness to be substantially the same. However, the present disclosure is not limited to this. For example, the side wall of the portion of the first active layer 1019 on the vertical sidewall of the ridge-like structure may be recessed relative to the sidewall of the spacer 1017, or may even protrude.

Due to this epitaxial growth, the material of the first active layer 1019 may be appropriately selected according to the performance requirements of the design on the device. For example, the first active layer 1019 may include various semiconductor materials, such as Si, Ge, SiGe, GaAs, InGaAs, or so on.

In the example of FIG. 7(*a*), the first active layer 1019 on the opposite sides of the isolation portion 1007 may have substantially the same characteristics (for example, materials, dimensions, etc.). However, the present disclosure is not limited to this. For example, according to design performance requirements for two devices on the opposite sides of the isolation portion 1007, the first active layer 1019 on the opposite sides of the isolation portion 1007 may have different characteristics, such as different materials and/or sizes. This may be achieved by shielding another device area when the first active layer is grown in one device area. For example, FIG. 7(*b*) shows that the first active layers 1019*a* and 1019*b* on the opposite sides of the isolation portion 1007 may have different thicknesses.

In order to facilitate subsequent electrical contact to the lower source/drain portion, a contact area may be formed in the transversely extending portion of the first active layer 1019. For example, ion implantation may be used to implant dopants into the transversely extending portion of the first active layer 1019. The conductivity type of the dopants may be the same as the conductivity type of the lower end contact portion formed later. For example, for a p-type device, p-type dopants such as B, $BF_2$ or In may be implanted with a concentration selected from about 1E19-1E21 $cm^{-3}$; for a n-type device, n-type dopants such as P or As may be implanted with a concentration selected from approximately 1E19-1E21 $cm^{-3}$. The transversely extending portion of the first active layer 1019 containing the dopants (which may be activated by a subsequent annealing process) may form a contact area (see 1019*c* in FIG. 8). Due to the existence of the spacer 1017, ion implantation may not substantially affect the vertical portion of the first active layer 1019 (the channel portion is subsequently formed).

In order to further reduce the contact resistance, silicide may also be formed on the transversely extending portion of the first active layer 1019. For example, a shielding layer (for example, oxynitride in the form of a spacer) may be used to shield the transversely extending portion of the first active layer 1019, and then metal such as NiPt, Co, Ni, Ti, etc. is deposited on the transversely extending portion of the first active layer 1019, and an annealing process is performed to make the metal react with the transversely extending portion of the first active layer 1019, thereby generating silicide. After that, unreacted metal may be removed, and the shielding layer may be removed.

Figure 8:
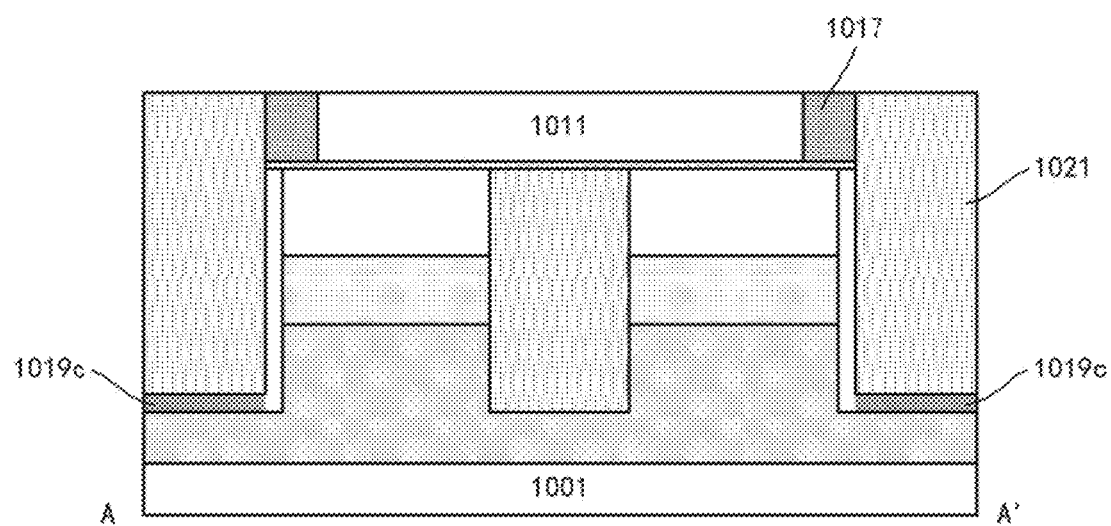

As shown in FIG. 8, an isolation layer 1021 may be formed around the ridge-like structure on whose side wall the first active layer 1019 is formed. For example, an oxide layer that completely covers the ridge-like structure may be formed on the substrate 1001 by deposition, and the deposited oxide layer may be planarized, such as chemical mechanical polishing (CMP) (CMP may stop at the mandrel pattern 1011) to form the isolation layer 1021.

Figure 9A:
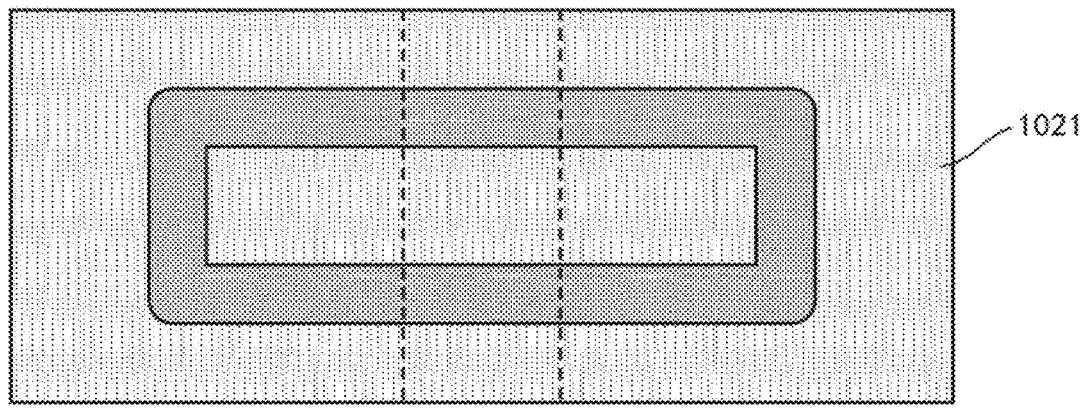
Figure 9B:
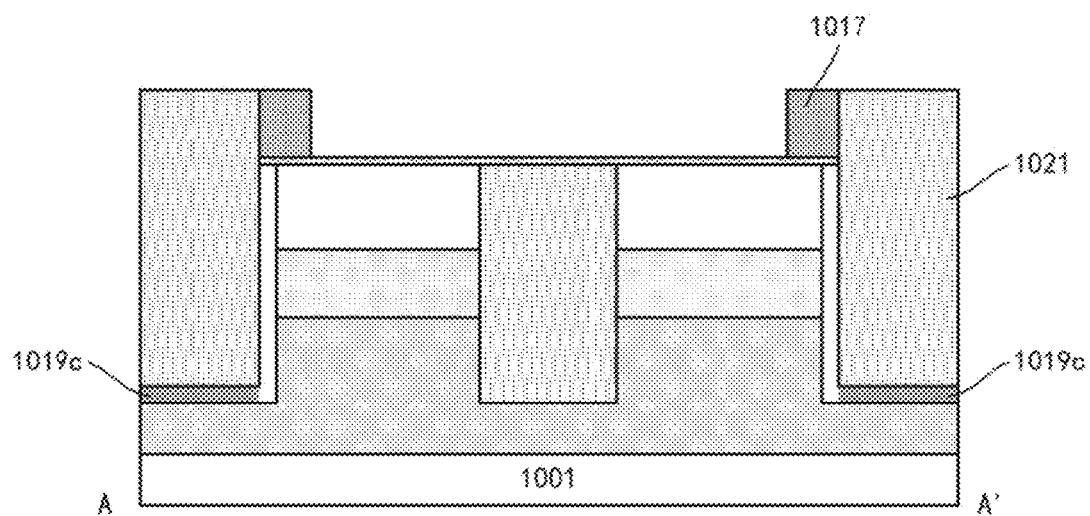

As shown in FIGS. 9(*a*) and 9(*b*), the mandrel pattern 1011 may be removed by selective etching such as wet etching using TMAH solution or dry etching using RIE. In this way, the annular spacer 1017 is left on the ridge-like structure. As shown in the top view of FIG. 9(*a*), the spacer 1017 respectively defines two U-shapes opposite to each other on the opposite sides of the isolation portion.

Figure 10:
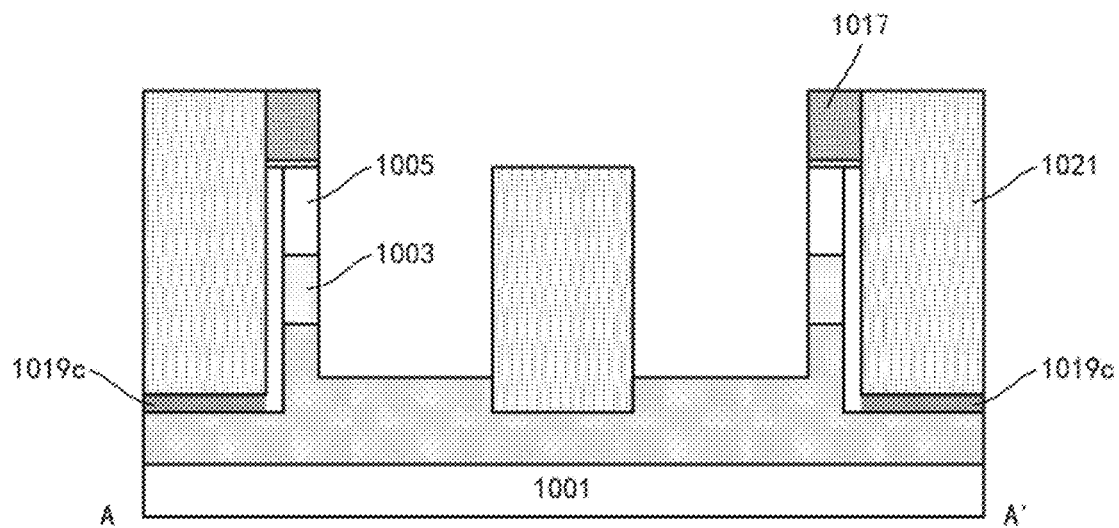

As shown in FIG. 10, the spacer 1017 may be used as an etching mask, and the etch stop layer 1009, the third material layer 1005, the second material layer 1003 and the upper portion of the substrate 1001 may be selectively etched in sequence, for example by RIE. The etching may be performed into the well region of the substrate 1001. In this way, on the opposite sides of the isolation portion, the third material layer 1005, the second material layer 1003, and the upper portion of the substrate 1001 respectively form a U shape corresponding to the spacer 1017.

Of course, the formation of the U-shaped pattern is not limited to the spacer pattern transfer technology, and may also be performed by photolithography using photoresist or the like.

Here, for the purpose of epitaxial growth, the second material layer 1003 used to define the gate stack position includes a semiconductor material, which is inconvenient in the following processing of the source/drain portion. For this, the second material layer 1003 may be replaced with a dielectric material to form a dummy gate to facilitate subsequent processing of the source/drain portion.

Figure 11A:
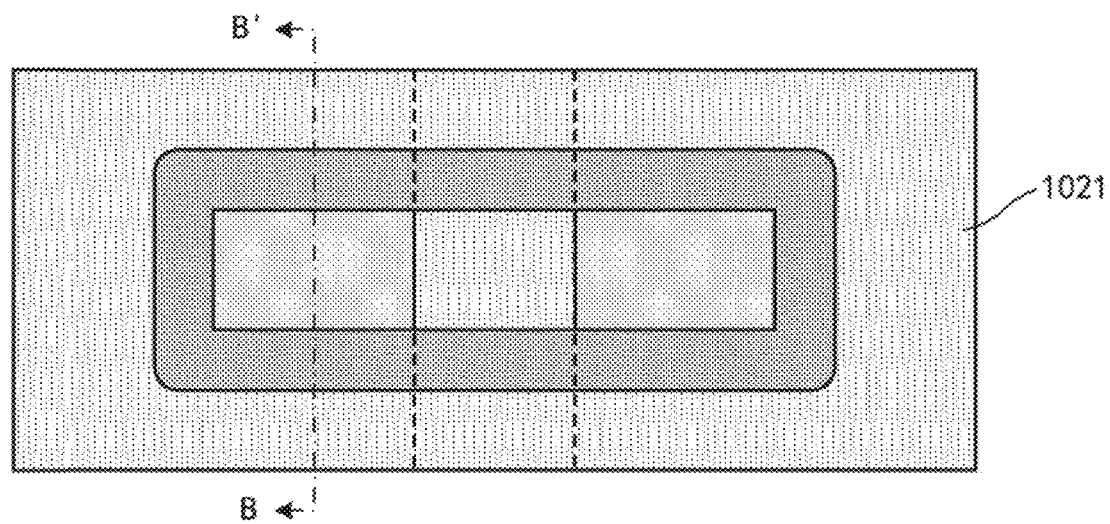
Figure 11B:
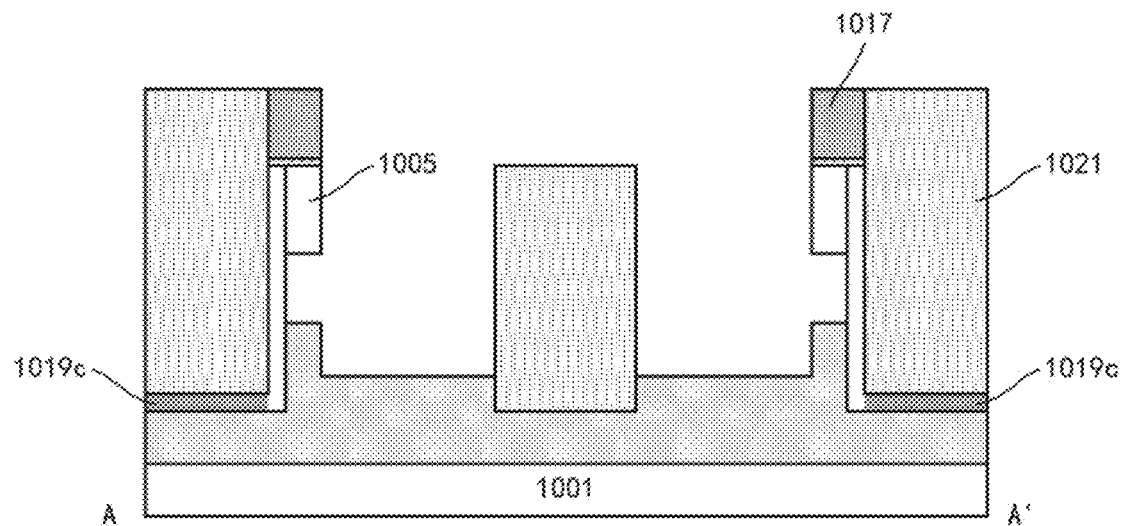
Figure 11C:
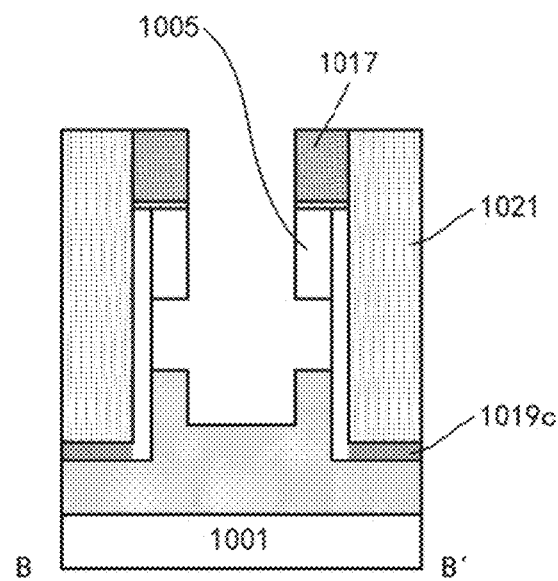
FIGS. 11(c), 12(b), 14(b), 15(c), 16(b), 17(b), 18(b), 19(b), and 20(b) are cross-sectional views along respective line BB'.
Figure 12A:
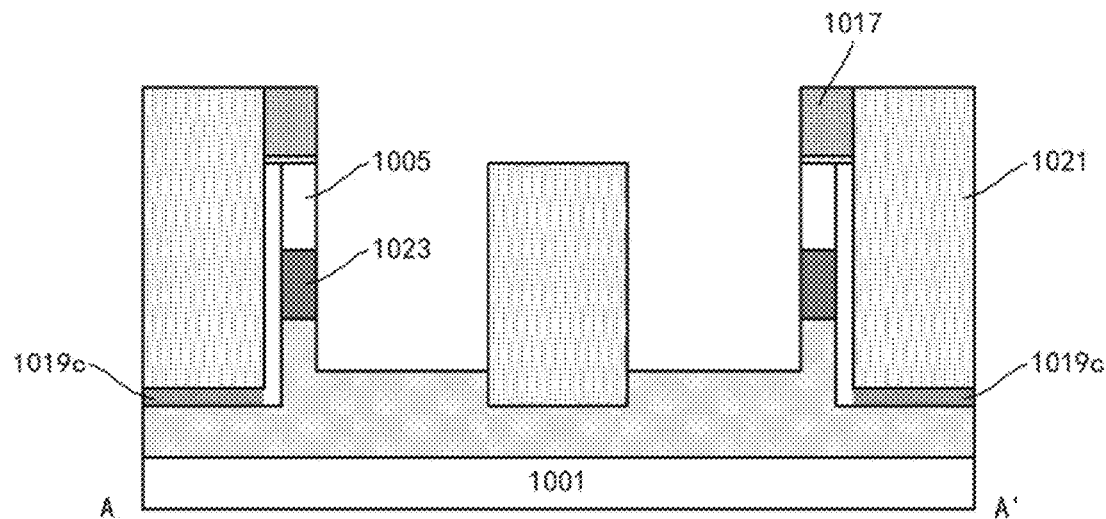
Figure 12B:
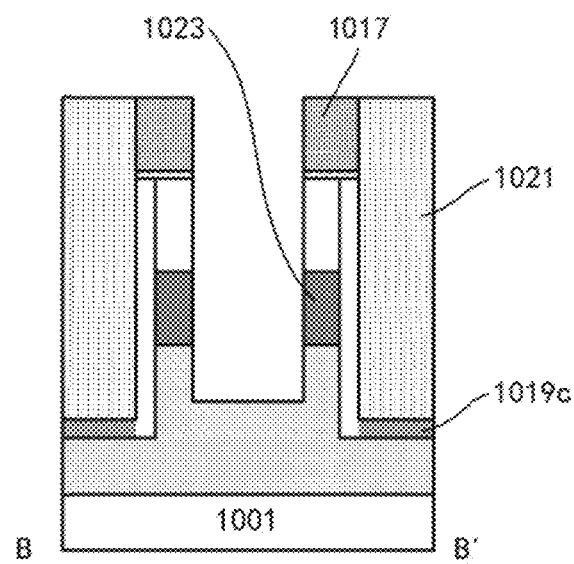

For example, as shown in FIGS. 11(*a*) to 11(*c*), the second material layer 1003 (SiGe in this example) may be removed by selectively etching relative to the first active layer 1019, the substrate 1001, and the third material layer 1005 (all of them are Si in this example). Then, as shown in FIGS. 12(*a*) and 12(*b*), a dummy gate 1023 may be formed in the space left under the spacer 1017 due to the removal of the second material layer 1003. The dummy gate 1023 may be formed by deposition and then etched back. For example, the dummy gate 1023 may include a material having etching selectivity with respect to the first material layer, the third material layer, and the first active layer, such as SiC.

Figure 13:
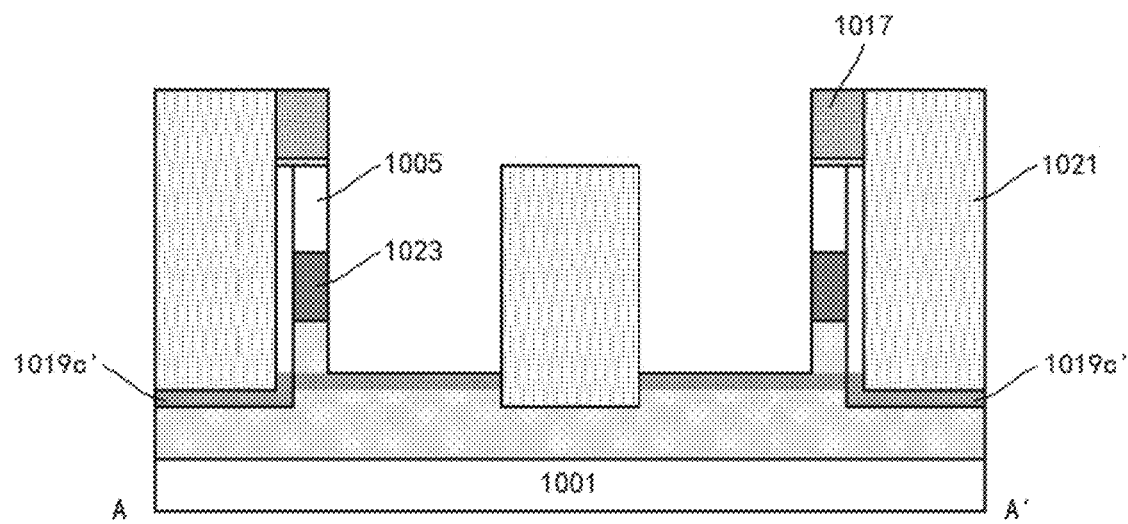

According to the embodiment, the contact area 1019*c* may be thickened to reduce the contact resistance from the subsequently formed contact portion to the lower source/drain portion. For example, as shown in FIG. 13, dopants may be implanted into the substrate 1001 inside the spacer 1017 by ion implantation. The conductivity type of the dopant may be the same as the conductivity type of the lower end contact portion formed later. For example, for a p-type device, p-type dopants such as B, $BF_2$ or In may be implanted with a concentration selected from about 1E19-1E21 $cm^{-3}$; for n-type a device, n-type dopants such as P or As may be implanted with a concentration selected from about 1E19-1E21 $cm^{-3}$. In the substrate 1001 on the inner and outer sides of the spacer 1017, the dopants implanted twice in succession may be connected to each other by annealing, and they are shown together as 1019*c'* in the figure.

Figure 14A:
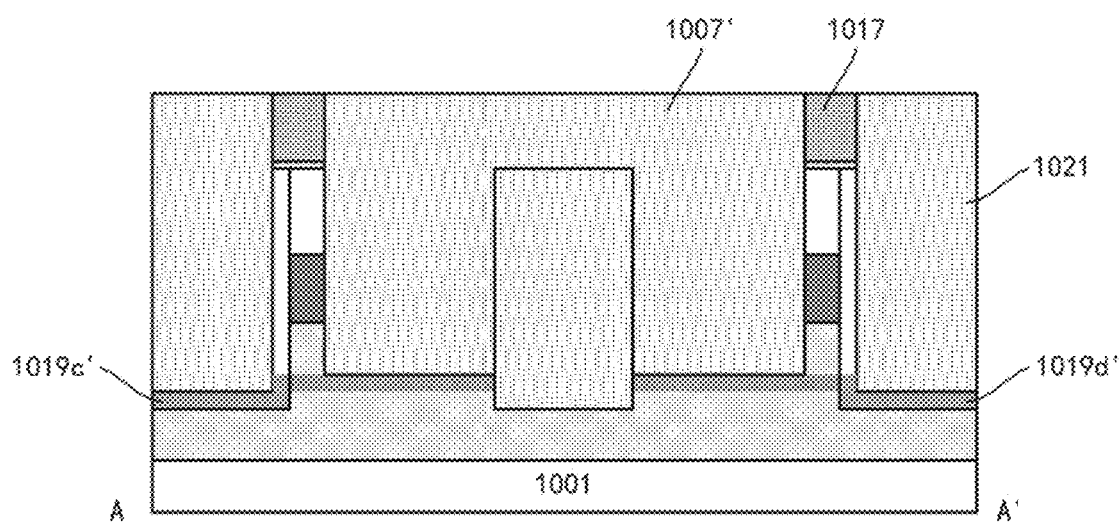
Figure 14B:
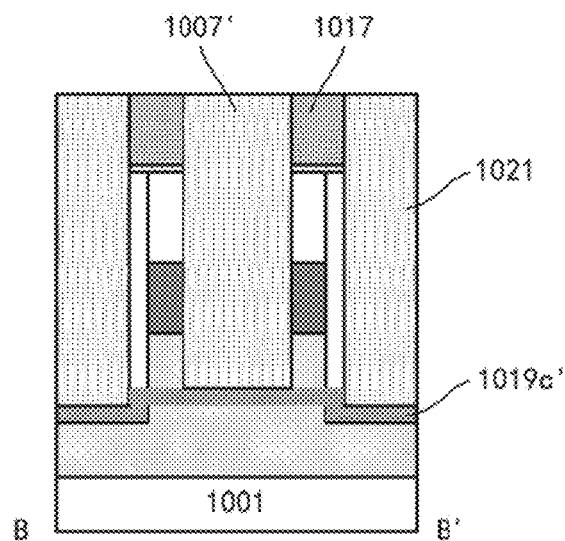
Figure 15A:
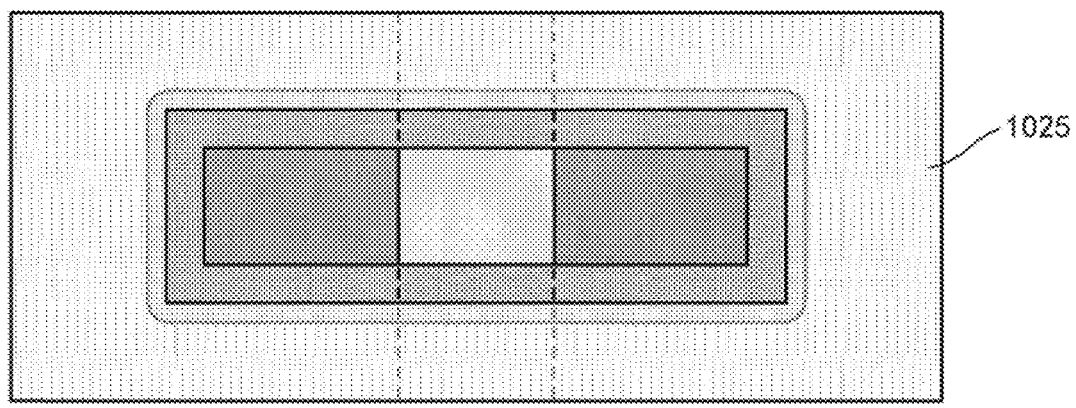
Figure 15B:
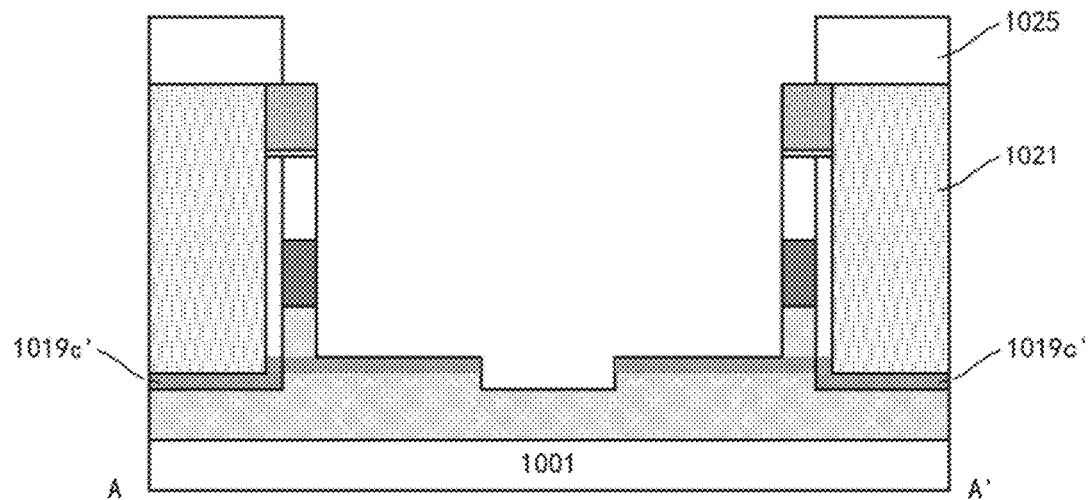
Figure 15C:
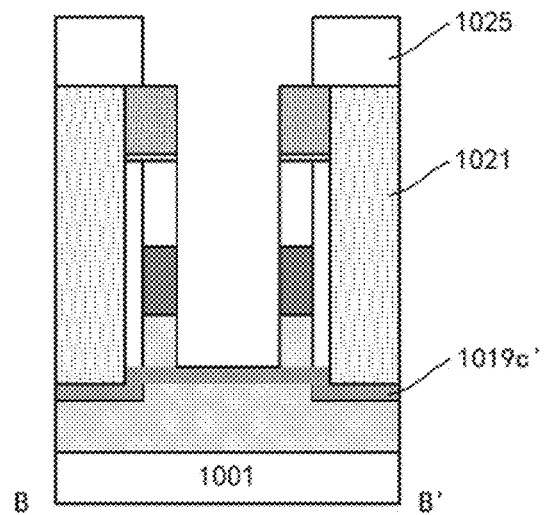

Currently, the isolation portion 1007 occupies a considerable space inside the spacer 1017, which is disadvantageous for filling the space with a solid phase dopant source layer later. The isolation portion 1007 may be recessed (or even removed) to release the space inside the spacer 1017. In order to avoid excessive influence on the exposed surface of the substrate 1001 when the isolation portion 1007 is etched, as shown in FIGS. 14(*a*) and 14(*b*), the inside of the spacer 1017 may be filled with the dielectric material (here, oxide) 1007' which is the same as the isolation portion 1007, for example, by way of deposition and then planarization (stopped at the spacer 1017). Afterwards, as shown in FIGS. 15(*a*) to 15(*c*), the isolation layer 1021 outside the spacer 1017 may be shielded by a shielding layer such as photoresist 1025 to expose the dielectric 1007' inside the spacer 1017, and the exposed dielectric 1007' and the isolation portion 1007 (that may be exposed later) are etched back, for example, using RIE. In the case where the isolation layer 1021 outside the spacer has etching selectivity with respect to the dielectric 1007' and the isolation portion 1007, the photoresist 1025 is not required.

In addition, if the respective lower source/drain portions of the two devices on the opposite sides of the isolation portion 1007 need to be connected to each other, the dielectric 1007' and the isolation portion 1007 inside the spacer 1017 may be removed to form a connection area between the two devices. Then, inside the spacer 1017, the surface of the substrate 1001 is exposed. Afterwards, the photoresist 1025 may be removed. The connection may be realized by doping the exposed surface of the substrate 1001 inside the spacer 1017. The doping treatment on the surface of the substrate 1001 may be performed together with treatment on the source/drain portion. It should be pointed out that if there is no need to connect the lower source/drain portions of the two devices, the isolation portion 1007 may not be completely removed, a certain thickness may be left.

Afterwards, the source/drain portion may be formed.

Figure 16A:
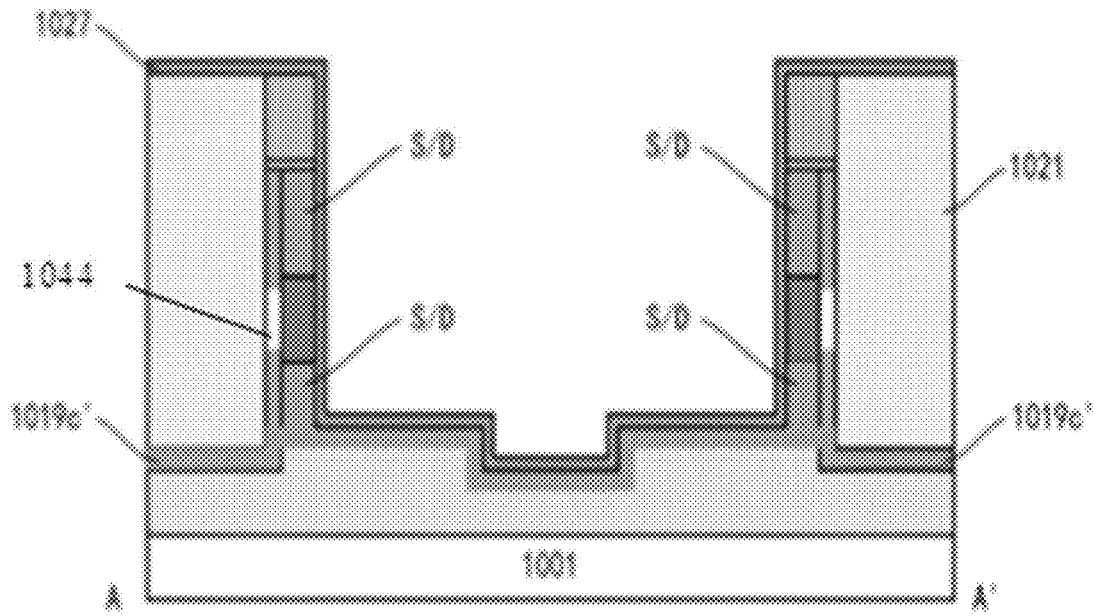
Figure 16B:
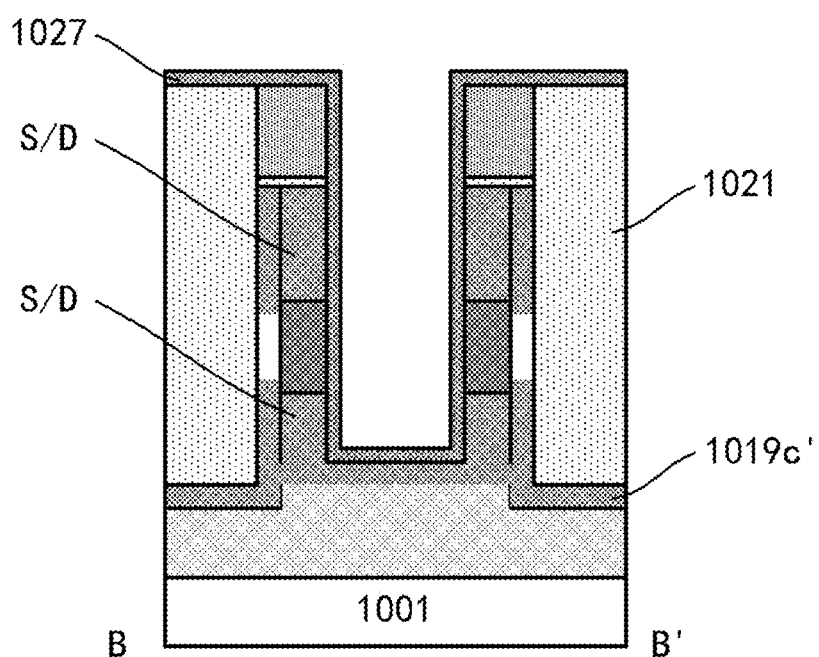

As shown in FIGS. 16(*a*) and 16(*b*), a solid phase dopant source layer 1027 may be formed on the structure (removing the photoresist) shown in FIGS. 15(*a*) to 15(*c*) by, for example, deposition. For example, the solid phase dopant source layer 1027 may be an oxide containing dopants. The dopants contained in the solid phase dopant source layer 1027 may be used to dope the source/drain portion and the exposed surface of the substrate 1001, and thus may have the same conductivity type as the source/drain portion to be formed. For example, for a p-type device, the solid-phase dopant source layer 1027 may contain p-type dopants such as B or In; for a n-type device, the solid-phase dopant source layer 1027 may contain n-type dopants such as P or As. The dopant concentration of the solid phase dopant source layer 1027 may be selected from about 0.01%-5%. The dopants in the solid phase dopant source layer 1027 may be driven into the first material layer and the third material layer to form the source/drain portion S/D, and may be driven into the exposed surface of the substrate 1001 to form the connection area connecting the lower source/drains S/D of the two devices through an annealing treatment. In the source/drain S/D, the concentration of the dopants may be selected from about $1E19$-$1E21$ $cm^{-3}$. After that, the solid phase dopant source layer 1027 may be removed.

According to an embodiment, the dopants may also be driven into the first active layer 1019, and desirably into the end portion of the portion (defining the channel portion 1044) of the first active layer 1019 covered by the dummy gate 1023, thereby the doped profile of the source/drain portion may have some overlap with the dummy gate 1023 (and the gate stack formed later), which facilitates reducing external resistance.

In this example, the dopants may be driven into the first active layer 1019 from the upper and lower sides of the dummy gate via the first material layer and the third material layer, respectively. Therefore, the degree to which the dopant is driven into the first active layer (more specifically, the portion of the first active layer covered by the dummy gate) may be substantially the same at the upper and lower surfaces of the dummy gate. More specifically, the distance between the doped interface between the upper source/drain portion S/D and the channel portion and the upper surface of the dummy gate may be substantially equal to the distance between the doped interface between the lower source/drain portion S/D and the channel portion and the lower surface of the dummy gate. The distance may be selected from about 2 nm-10 nm, for example. In addition, the distance may be kept substantially constant along the longitudinal extension direction of the dummy gate.

In this example, the first material layer is provided through the upper portion of the substrate 1001. However, the present disclosure is not limited to this. For example, the first material layer may also be an epitaxial layer on the substrate 1001. In this case, the first material layer and the third material layer may be doped in situ during epitaxial growth, instead of using a solid phase dopant source layer for doping.

In addition, in this example, the source/drain portions S/D are formed directly based on the first material layer and the third material layer. However, the present disclosure is not limited to this.

Figure 17A:
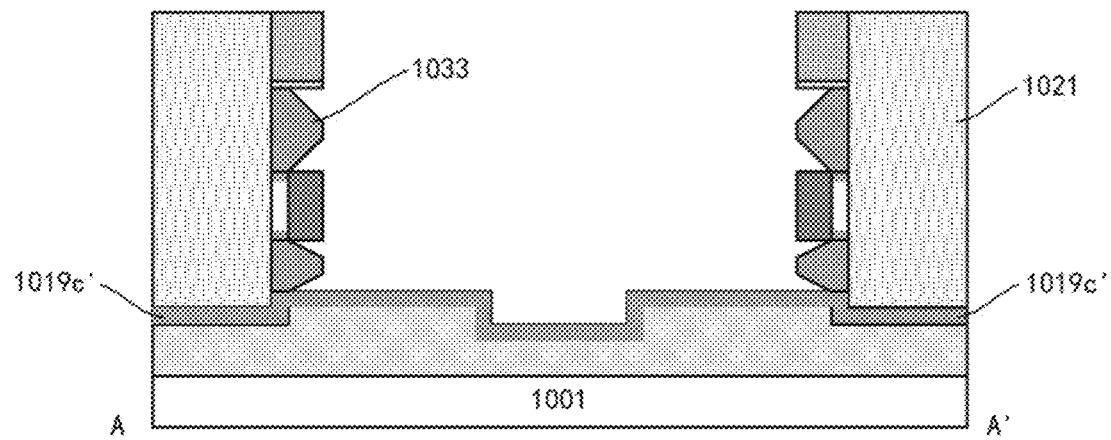
Figure 17B:
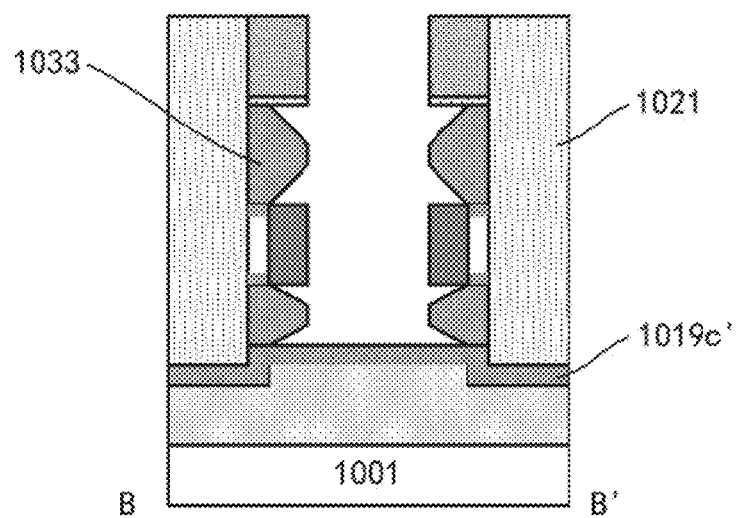

For example, as shown in FIGS. 17(*a*) and 17(*b*), the first material layer and the third material layer may be at least partially etched back by selective etching. Etching back may be performed into the first active layer, but it is desirable to leave a certain thickness of semiconductor layer (the first material layer, the third material layer, or the first active layer) on the upper and lower sides of the dummy gate to serve as a seed layer for subsequent epitaxial growth. Afterwards, the second active layer 1033 may be formed on the upper and lower sides of the dummy gate by selective epitaxial growth. The second active layer 1033 may be doped in-situ during growth. In addition, an annealing process may be performed to activate the dopants, and the dopants may be driven into the first active layer, so that the doped profiles of the source/drain portions as described above may have some overlap with the dummy gate 1023 (and the gate stack formed later).

Here, the connection area is also shown. Since the solid phase dopant source layer is not formed as described above, the middle portion of the connection area (see FIG. 15(*b*)) may be formed by additional ion implantation.

Here, the material of the second active layer 1033 may be selected, for example, as a semiconductor material having a different lattice constant from the first active layer, so as to apply stress to the channel area formed in the first active layer, to enhance device performance. For example, for a p-type device, the second active layer 1033 may include SiGe (the atomic percentage of Ge is selected, for example, from about 0-75%), when the atomic percentage of Ge is greater than 0, compressive stress may be applied to the channel portion; for a n-type device, the second active layer 1033 may include Si:C (the atomic percentage of C is selected, for example, from about 0-3%), when the atomic percentage of C is greater than 0, tensile stress may be applied to the channel portion.

In addition, the grown second active layer 1033 may have a shape (for example, a substantially trapezoidal shape) that tapers toward the inside in a cross-sectional view, which helps reduce the capacitance between the source/drain portion and the gate stack.

Next, a replacement gate process may be performed to replace the dummy gate with a gate stack.

Figure 18A:
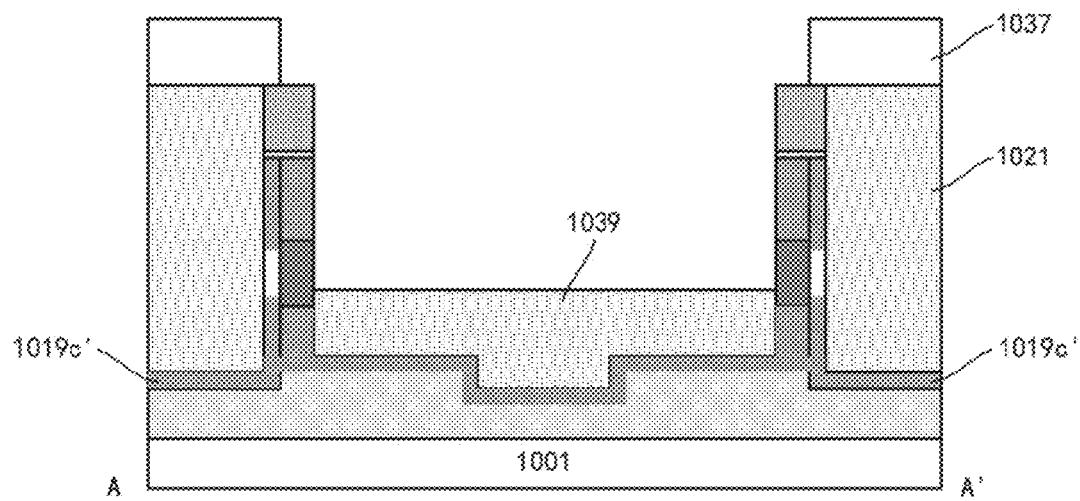
Figure 18B:
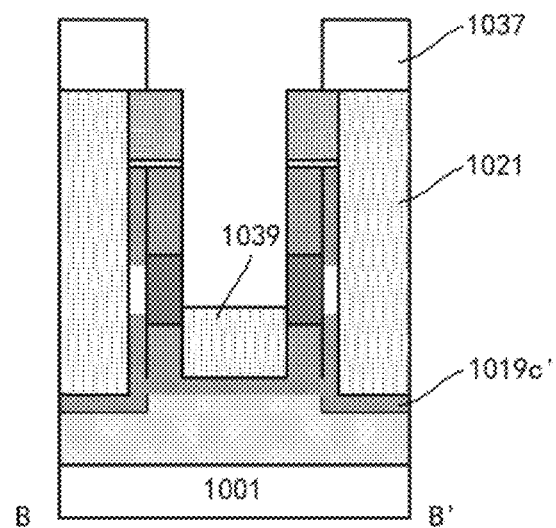

As shown in FIGS. 18(*a*) and 18(*b*), an isolation layer 1039 may be formed inside the spacer 1017. For example, a dielectric material such as oxide may be deposited to completely fill the space inside the spacer 1017. Then, the deposited dielectric material may be planarized, such as using CMP, and the CMP may stop at the spacer 1017. In the case where the deposited dielectric material and the isolation layer 1021 contain the same material such as oxide, a shielding layer such as photoresist 1037 may be formed to shield the isolation layer 1021 outside the spacer 1017. Afterwards, the deposited dielectric material may be etched back. A certain thickness of dielectric material is left at the bottom of the space inside the spacer 1017 to form the isolation layer 1039 as shown. The isolation layer 1039 may shield the source/drain portion at the lower end, for example, the top surface thereof is (slightly) higher than the bottom surface of the dummy gate, but the sidewall of the dummy gate is fully exposed for subsequent removal of the dummy gate and filling of the gate stack. Afterwards, the photoresist 1037 may be removed.

Figure 19A:
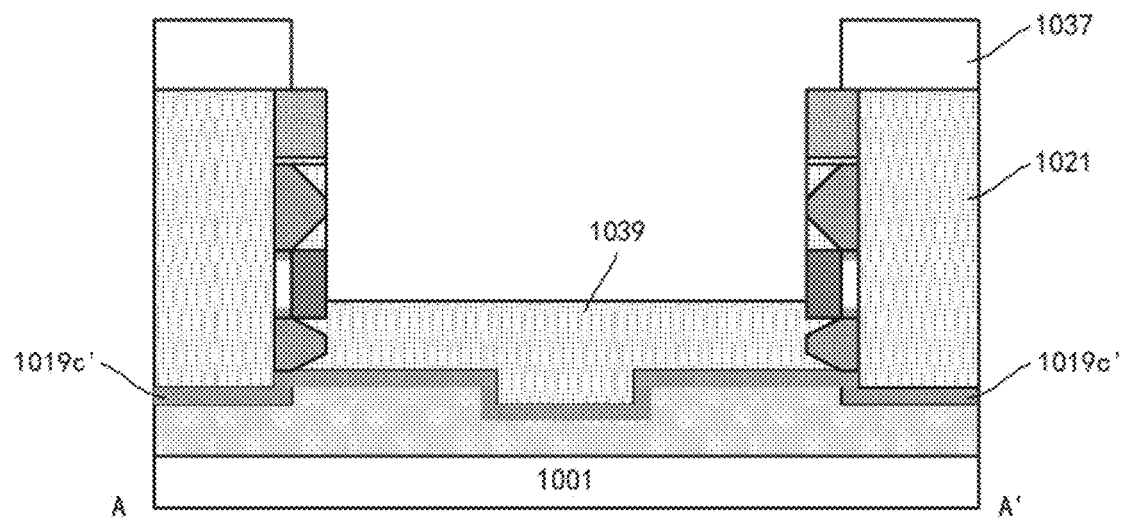
Figure 19B:
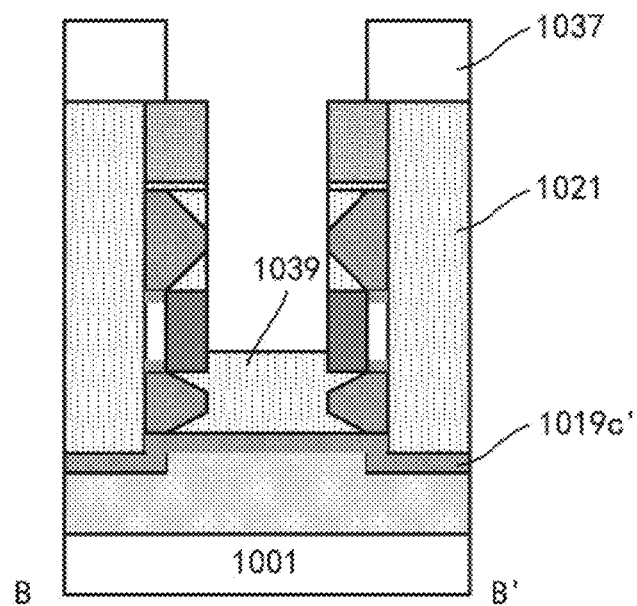

FIGS. 19(*a*) and 19(*b*) show an example of forming an isolation layer 1039 in the case where the second active layer 1033 is additionally formed as shown in FIGS. 17(*a*) and 17(*b*).

Figure 20A:
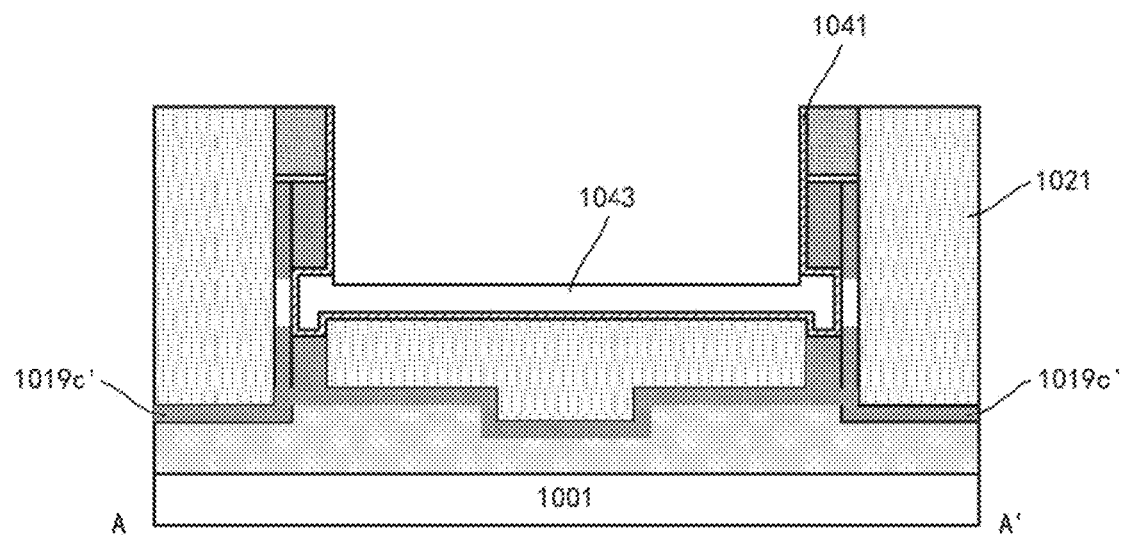
Figure 20B:
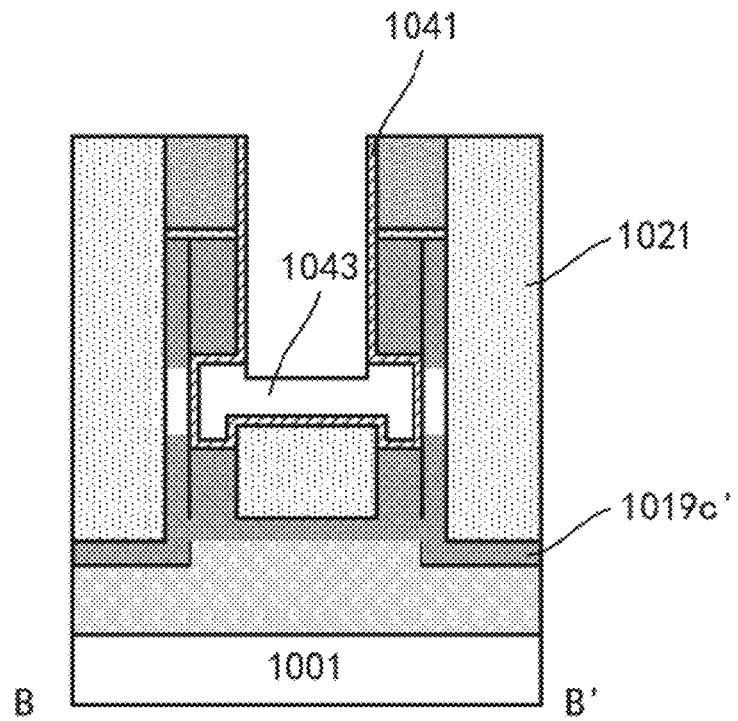

Then, as shown in FIGS. 20(*a*) and 20(*b*), the dummy gate may be removed by selective etching, and the gate stack may be formed inside the spacer 1017. For example, the gate dielectric layer 1041 may be formed in a substantially conformal manner by deposition, and the gate conductor layer 1043 may be filled in the remaining space. The filled gate conductor layer 1043 may be planarized, such as using CMP, and the CMP may stop at the spacer 1017. Then, the gate conductor layer 1043 may be etched back to make its top surface lower than the top surface of the previous dummy gate, so as to reduce the capacitance between the source/drain portion and the gate stack. In this way, the end portion of the formed gate stack is embedded in the space where the previous dummy gate is located, and overlaps with the first active layer, thereby defining the channel portion in the first active layer. In addition, in the plan view, the gate stack may be on the isolation layer 1039 and covers almost the entire space inside the spacer 1017.

For example, the gate dielectric layer 1041 may include a high-k gate dielectric such as $HfO_2$, and the thickness is, for example, selected from about 1 nm-5 nm. Before forming the high-k gate dielectric, an interface layer may also be formed, for example, an oxide formed by an oxidation process or deposition such as atomic layer deposition (ALD), with a thickness selected from about 0.3 nm-1.5 nm. The gate conductor layer 1043 may include a work function adjusting metal such as TiN, TaN, TiAlC, etc., and a gate conductive metal such as W.

Figure 21A:
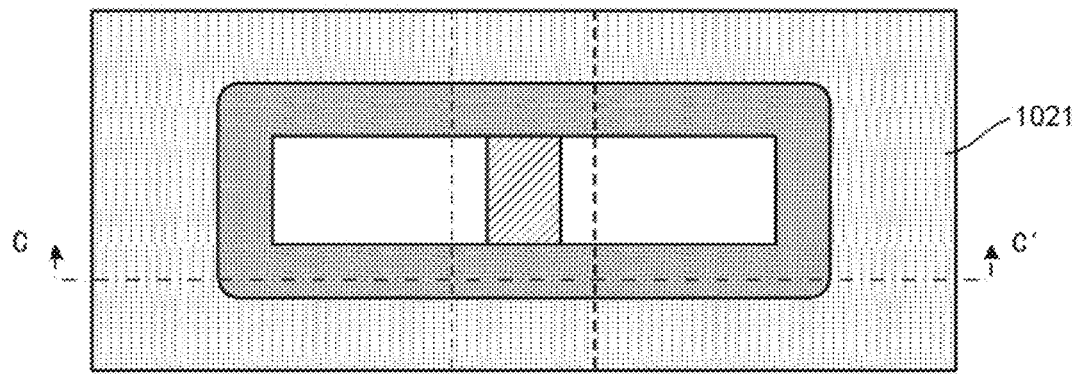
Figure 21B:
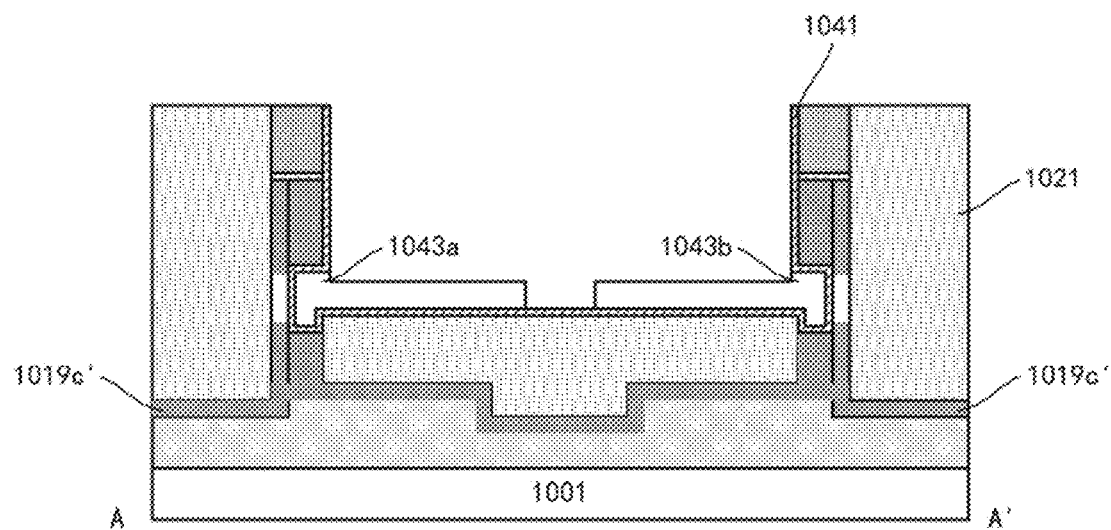

According to the device design, as shown in FIGS. 21(*a*) and 21(*b*), the gate conductor layer 1043 may be disconnected between the two devices by, for example, photolithography. Thus, the gate conductor layer is divided into gate conductor layers 1043*a* and 1043*b* for two devices, respectively, and combined with the gate dielectric layer 1041 to define the gate stacks for two devices.

So far, the fabrication of the device basic structure is completed. Subsequently, various contact portions, interconnect structures, etc. may be made.

Figure 22A:
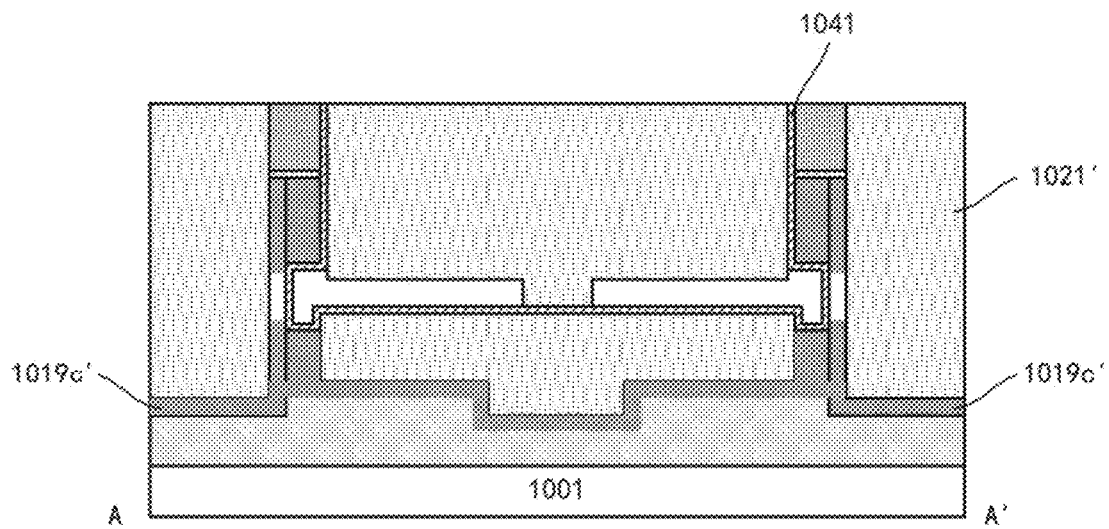
Figure 22B:
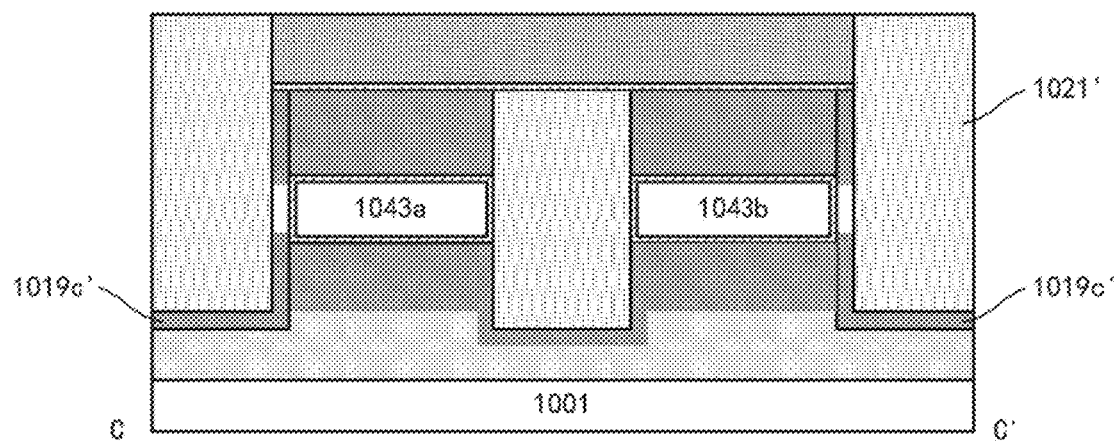
FIG. 22(b) is a cross-sectional view along respective line CC'.
Figure 23:
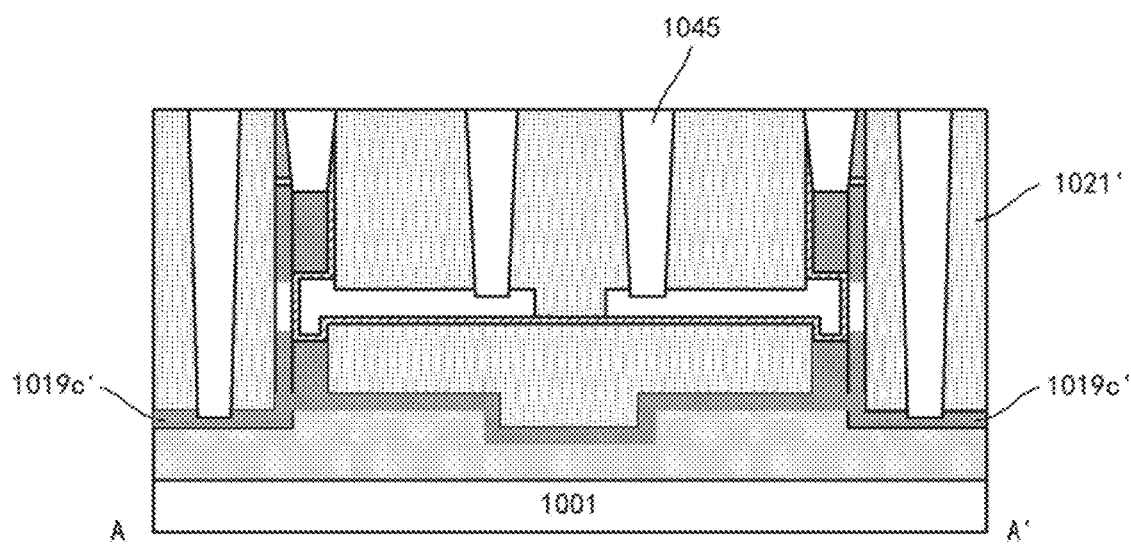

For example, as shown in FIGS. 22(*a*) and 22(*b*), the space inside the spacer 1017 may be filled with a dielectric material such as oxide (along with the previous isolation layer are together shown as 1021') by, for example, deposition and then planarization. As shown in FIG. 22(*b*), the previously formed isolation portion 1007 is still left under the spacer 1017. Then, as shown in FIG. 23, one or more contact holes may be formed in the isolation layer 1021', and a conductive material such as metal may be filled in the one or more contact holes to form a contact portion 1045. The contact portion 1045 may include a contact portion to the source/drain portion of each device and the contact portion to the gate conductor.

The semiconductor device according to the embodiments of the present disclosure may be applied to various electronic apparatuses. For example, it is possible to form an integrated circuit (IC) based on such a semiconductor device, and then to construct an electronic apparatus. Therefore, the present disclosure also provides an electronic apparatus including the above-mentioned semiconductor device. The electronic apparatus may also include components such as a display screen matched with the integrated circuit and a wireless transceiver matched with the integrated circuit. Such electronic apparatuses include smart phones, computers, tablet computers (PCs), wearable smart devices, mobile power supplies, etc.

According to an embodiment of the present disclosure, a method of manufacturing a system on chip (SoC) is also provided. The method may include the method described above. Specifically, a variety of devices may be integrated on a chip, at least some of which are manufactured according to the method of the present disclosure.

Embodiments are provided according to the following clauses:

1. A semiconductor device, comprising:
a channel portion extending vertically on a substrate and having a U-shape in a plan view;
source/drain portions located at upper and lower ends of the channel portion and along the U-shaped channel portion; and
a gate stack overlapping the channel portion on an inner side of the U shape.

2. The semiconductor device according to clause 1, wherein the channel portion has substantially the same thickness along the U shape.

3. The semiconductor device according to clause 1, wherein the U shape has rounded corners.

4. The semiconductor device according to clause 1, wherein the channel portion has a first outer side surface and a second outer side surface opposite to each other, and a third outer side surface between the first outer side surface and the second outer side surface, the first outer side surface, the second outer side surface, and the third outer side surface are all substantially flat.

5. The semiconductor device according to clause 4, wherein the first outer side surface and the second outer side surface extend substantially in parallel.

6. The semiconductor device according to clause 1, wherein the source/drain portions protrude toward the inner side of the U shape with respect to the channel portion, so that the source/drain portions and the channel portion are C-shaped in a cross-sectional view.

7. The semiconductor device according to clause 6, wherein an end portion of the gate stack close to the channel portion is embedded in the C shape.

8. The semiconductor device according to clause 6, wherein an upper surface of the source/drain portion at the upper end of the channel portion is substantially flat, and a lower surface of the source/drain portion at the upper end of the channel portion is substantially flat.

9. The semiconductor device according to clause 6, wherein the source/drain portion has a shape that tapers toward the inner side of the U shape in the cross-sectional view.

10. The semiconductor device according to clause 1, wherein a distance between a doped interface between the upper source/drain portion and the channel portion and an upper surface of an end portion of a side of the gate stack close to the channel portion is substantially equal to a distance between a doped interface between the lower source/drain portion and the channel portion and the lower surface of the end of the side of the gate stack close to the channel portion.

11. The semiconductor device according to clause 10, wherein the distance is 2 nm-10 nm.

12. The semiconductor device according to clause 1, wherein a doped profile of the source/drain portion has an end portion that overlaps the gate stack.

13. The semiconductor device according to clause 1, wherein the channel portion is formed in a first semiconductor layer, and the first semiconductor layer extends vertically to the source/drain portion so that end portions at the upper and lower ends respectively constitute a portion of the corresponding source/drain portion, the source/drain portion also comprises a second semiconductor layer and a third semiconductor layer on the end portions of upper and lower ends of the first semiconductor layer.

14. The semiconductor device according to clause 13, wherein the second semiconductor layer and the third semiconductor layer comprise a different material from the first semiconductor layer.

15. The semiconductor device according to clause 13, wherein the third semiconductor layer is part of the substrate.

16. The semiconductor device according to clause 13, wherein the first semiconductor layer further comprises a portion on the substrate that extends transversely toward an outer side of the U shape.

17. The semiconductor device according to clause 1, wherein outer sidewalls of at least an upper portion of the lower source/drain portion, the upper source/drain portion, and the channel portion are substantially coplanar.

18. The semiconductor device according to clause 1, wherein the channel portion and the source/drain portion comprise a single crystal semiconductor material.

19. The semiconductor device according to clause 1, wherein, in a plan view, the gate stack is located inside of the U shape.

20. The semiconductor device according to clause 19, wherein, in the plan view, the gate stack extends throughout the inside of the U shape.

21. The semiconductor device according to clause 1, wherein a plurality of the semiconductor devices are provided on the substrate, wherein openings of U shapes of at least a pair of semiconductor devices are opposite to each other.

22. The semiconductor device according to clause 21, wherein corresponding arms of the U shapes of the pair of semiconductor devices are substantially coplanar.

23. The semiconductor device according to clause 21, further comprising a hard mask layer on the upper source/drain portion, wherein hard mask layers of the pair of semiconductor devices form a closed loop.

24. A method of manufacturing a semiconductor device, comprising:
   providing a stack of a first material layer, a second material layer and a third material layer on a substrate;
   patterning the stack into a bar shape extending along a first direction;
   forming a first active layer on a sidewall of the stack patterned in the bar shape;
   forming a bar-shaped opening extending in a first direction in the stack patterned in the bar shape, so that the stack is annular;
   replacing the second material layer with a dummy gate through the opening;
   forming source/drain portions on upper and lower sides of the dummy gate;
   removing the dummy gate through the opening; and
   forming a gate stack in the opening, an outer edge of the gate stack being embedded in a space left due to the removal of the dummy gate.

25. The method according to clause 24, wherein the first material layer is an upper portion of the substrate or an epitaxial layer on the substrate.

26. The method according to clause 24, wherein the second material layer has an etching selectivity relative to the first material layer and the third material layer.

27. The method according to clause 24, wherein patterning the stack into a bar shape comprises:
   forming a bar-shaped mandrel layer extending in the first direction on the third material layer;
   forming a spacer around an outer peripheral sidewall of the mandrel layer; and
   using the mandrel layer and the spacer as a mask to etch the stack.

28. The method according to clause 27, wherein forming the first active layer comprises:
   etching back the stack, so that a sidewall of the stack is relatively recessed with respect to a sidewall of the spacer; and
   forming a first active layer on the sidewall of the stack through epitaxial growth.

29. The method according to clause 28, wherein the first active layer comprises a portion extending transversely on the substrate, and the method further comprises forming a contact area in the transversely extending portion.

30. The method according to clause 27, further comprising:
   forming an isolation layer on the substrate; and
   planarizing the isolation layer to expose the mandrel layer.

31. The method according to clause 30, wherein forming the opening comprises:
   removing the mandrel layer; and
   using the spacer as a mask to etch the stack.

32. The method according to clause 24, wherein forming the source/drain portion comprises:
   forming a dopant source layer on the inner wall of the annular stack; and
   driving the dopants in the dopant source layer into the first material layer, the third material layer and upper and lower ends of the first active layer.

33. The method according to clause 24, wherein forming the source/drain portion comprises:
   at least partially removing the first material layer and the third material layer;
   growing a second active layer on the upper and lower sides of the dummy gate.

34. The method according to clause 33, further comprising:
   doping the second active layer in situ when growing the second active layer; and
   driving the dopants in the second active layer into the upper and lower ends of the first active layer.

35. The method according to clause 24, further comprising forming an isolation portion extending in a second direction intersecting the first direction in the stack, so that the stack comprises two portions located on two opposite sides of the isolation portion.

36. An electronic apparatus, comprising the semiconductor device according to clause 1.

37. The electronic apparatus according to clause 36, comprising smart phones, computers, tablets, wearable smart devices, artificial intelligence devices, and mobile power supplies.

In the above description, the technical details such as patterning and etching of each layer are not explained in detail. However, those skilled in the art should understand that various technical means may be used to form layers, areas, etc. of desired shapes. In addition, in order to form the same structure, those skilled in the art may also design a method that is not completely the same as the method described above. In addition, although the respective embodiments are described above respectively, this does not mean that the measures in the respective embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A semiconductor device, comprising:
   a channel portion extending vertically on a substrate and having a U-shape in a plan view;
   source/drain portions located at upper and lower ends of the channel portion and along the U-shaped channel portion; and
   a gate stack overlapping the channel portion on an inner side of the U shape.

2. The semiconductor device according to claim 1, wherein the channel portion has substantially the same thickness along the U shape.

3. The semiconductor device according to claim 1, wherein the U shape has rounded corners.

4. The semiconductor device according to claim 1, wherein the channel portion has a first outer side surface and a second outer side surface opposite to each other, and a third outer side surface between the first outer side surface and the second outer side surface, the first outer side surface, the second outer side surface, and the third outer side surface are all substantially flat.

5. The semiconductor device according to claim 4, wherein the first outer side surface and the second outer side surface extend substantially in parallel.

6. The semiconductor device according to claim 1, wherein the source/drain portions protrude toward the inner side of the U shape with respect to the channel portion, so that the source/drain portions and the channel portion are C-shaped in a cross-sectional view.

7. The semiconductor device according to claim 6, wherein an end portion of the gate stack close to the channel portion is embedded in the C shape.

8. The semiconductor device according to claim 6, wherein an upper surface of the source/drain portion at the upper end of the channel portion is substantially flat, and a lower surface of the source/drain portion at the upper end of the channel portion is substantially flat.

9. The semiconductor device according to claim 6, wherein the source/drain portion has a shape that tapers toward the inner side of the U shape in the cross-sectional view.

10. The semiconductor device according to claim 1, wherein a distance between a doped interface between the upper source/drain portion and the channel portion and an upper surface of an end portion of a side of the gate stack close to the channel portion is substantially equal to a distance between a doped interface between the lower source/drain portion and the channel portion and the lower surface of the end of the side of the gate stack close to the channel portion.

11. The semiconductor device according to claim 10, wherein the distance is selected from 2 nm-10 nm.

12. The semiconductor device according to claim 1, wherein a doped profile of the source/drain portions has an end portion that overlaps the gate stack.

13. The semiconductor device according to claim 1, wherein the channel portion is formed in a first semiconductor layer, the first semiconductor layer extends vertically to the source/drain portions so that end portions at the upper and lower ends respectively constitute a portion of the corresponding source/drain portions, and the source/drain portions also comprises a second semiconductor layer and a third semiconductor layer on the end portions of upper and lower ends of the first semiconductor layer.

14. The semiconductor device according to claim 13, wherein the second semiconductor layer and the third semiconductor layer comprise a different material from the first semiconductor layer.

15. The semiconductor device according to claim 13, wherein the third semiconductor layer is part of the substrate.

16. The semiconductor device according to claim 13, wherein the first semiconductor layer further comprises a portion on the substrate that extends transversely toward an outer side of the U shape.

17. The semiconductor device according to claim 1, wherein outer sidewalls of at least an upper portion of the lower source/drain portion, the upper source/drain portion, and the channel portion are substantially coplanar.

18. The semiconductor device according to claim 1, wherein the channel portion and the source/drain portions comprise a single crystal semiconductor material.

19. The semiconductor device according to claim 1, wherein, in a plan view, the gate stack is located inside of the U shape.

20. The semiconductor device according to claim 19, wherein, in the plan view, the gate stack extends throughout the inside of the U shape.

21. The semiconductor device according to claim 1, wherein a plurality of the semiconductor devices are provided on the substrate, and wherein openings of U shapes of at least a pair of semiconductor devices are opposite to each other.

22. The semiconductor device according to claim 21, wherein corresponding arms of the U shapes of the pair of semiconductor devices are substantially coplanar.

23. The semiconductor device according to claim 21, further comprising a hard mask layer on the upper source/drain portion, wherein hard mask layers of the pair of semiconductor devices form a closed loop.

24. An electronic apparatus, comprising the semiconductor device according to claim 1.

25. The electronic apparatus according to claim 24, comprising a smart phone, a computer, a tablet, a wearable smart device, an artificial intelligence device, or a mobile power supply.

26. A method of manufacturing, the method comprising:
   patterning a stack of a first material layer, a second material layer and a third material layer on a substrate, into a bar shape extending along a first direction;
   forming a first active layer on a sidewall of the stack patterned in the bar shape;
   forming a bar-shaped opening extending in a first direction in the stack patterned in the bar shape, so that the stack is annular;
   replacing the second material layer with a dummy gate through the opening;
   forming source/drain portions on upper and lower sides of the dummy gate;
   removing the dummy gate through the opening; and forming a gate stack in the opening, an outer edge of the gate stack being embedded in a space left due to the removal of the dummy gate, wherein, after at least the foregoing patterning, forming, replacing and removing, a semiconductor device is formed, the semiconductor device comprising:

a channel portion extending vertically on the substrate and having a U-shape in a plan view, the source/drain portions located at upper and lower ends of the channel portion and along the U-shaped channel portion, and the gate stack overlapping the channel portion on an inner side of the U shape.

27. The method according to claim 26, wherein the first material layer is an upper portion of the substrate or an epitaxial layer on the substrate.

28. The method according to claim 26, wherein the second material layer has an etching selectivity relative to the first material layer and the third material layer.

29. The method according to claim 26, wherein patterning the stack into a bar shape comprises:

forming a bar-shaped mandrel layer extending in the first direction on the third material layer;

forming a spacer around an outer peripheral sidewall of the mandrel layer; and using the mandrel layer and the spacer as a mask to etch the stack.

30. The method according to claim 29, wherein forming the first active layer comprises:

etching back the stack, so that a sidewall of the stack is relatively recessed with respect to a sidewall of the spacer; and forming a first active layer on the sidewall of the stack through epitaxial growth.

31. The method according to claim 30, wherein the first active layer comprises a portion extending transversely on the substrate, and the method further comprises forming a contact area in the transversely extending portion.

32. The method according to claim 29, further comprising:

forming an isolation layer on the substrate; and planarizing the isolation layer to expose the mandrel layer.

33. The method according to claim 32, wherein forming the opening comprises:

removing the mandrel layer; and using the spacer as a mask to etch the stack.

34. The method according to claim 26, wherein forming the source/drain portions comprises:

forming a dopant source layer on the inner wall of the annular stack; and driving the dopants in the dopant source layer into the first material layer, the third material layer and upper and lower ends of the first active layer.

35. The method according to claim 26, wherein forming the source/drain portions comprises:

at least partially removing the first material layer and the third material layer;

growing a second active layer on the upper and lower sides of the dummy gate.

36. The method according to claim 35, further comprising:

doping the second active layer in situ when growing the second active layer; and driving the dopants in the second active layer into the upper and lower ends of the first active layer.

37. The method according to claim 26, further comprising forming an isolation portion extending in a second direction intersecting the first direction in the stack, so that the stack comprises two portions located on two opposite sides of the isolation portion.

* * * * *